US008604791B2

(12) United States Patent
Vaughan, Jr. et al.

(10) Patent No.: US 8,604,791 B2
(45) Date of Patent: Dec. 10, 2013

(54) ACTIVE TRANSMIT ELEMENTS FOR MRI COILS AND OTHER ANTENNA DEVICES

(75) Inventors: John Thomas Vaughan, Jr., Stillwater, MN (US); Charles A. Lemaire, Apple Valley, MN (US)

(73) Assignees: Life Services, LLC, Minneapolis, MN (US); Regents of the University of Minnesota, Minneapolis, MN (US)

(*) Notice: Subject to any disclaimer, the term of this patent is extended or adjusted under 35 U.S.C. 154(b) by 578 days.

(21) Appl. No.: 12/879,000

(22) Filed: Sep. 9, 2010

(65) Prior Publication Data
US 2012/0062230 A1 Mar. 15, 2012

(51) Int. Cl.
*G01V 3/00* (2006.01)
(52) U.S. Cl.
USPC .......................................................... 324/318
(58) Field of Classification Search
USPC ................................................. 324/300–322
See application file for complete search history.

(56) References Cited

U.S. PATENT DOCUMENTS

| | | |
|---|---|---|
| 4,682,125 A | 7/1987 | Harrison et al. |
| 4,763,076 A | 8/1988 | Arakawa et al. |
| 4,894,589 A | 1/1990 | Borowiec |
| 4,947,119 A | 8/1990 | Ugurbil et al. |
| 5,075,600 A | 12/1991 | El-Hamasy et al. |
| 5,304,930 A | 4/1994 | Crowley et al. |
| 5,557,247 A | 9/1996 | Vaughan, Jr. |
| 5,714,831 A | 2/1998 | Walker et al. |
| 5,744,957 A | 4/1998 | Vaughan, Jr. |
| 5,886,596 A | 3/1999 | Vaughan, Jr. |
| 5,908,386 A | 6/1999 | Ugurbil et al. |
| 5,990,681 A * | 11/1999 | Richard et al. ................ 324/318 |
| 6,002,251 A | 12/1999 | Sun |
| 6,100,694 A * | 8/2000 | Wong ............................ 324/318 |
| 6,150,816 A * | 11/2000 | Srinivasan .................... 324/318 |

(Continued)

FOREIGN PATENT DOCUMENTS

| | | |
|---|---|---|
| WO | WO 2005111645 | 11/2005 |
| WO | WO 2006014260 | 2/2006 |
| WO | WO 2006121949 | 11/2006 |
| WO | WO 2008064365 | 5/2008 |

OTHER PUBLICATIONS

Cho, Y.K., et al., "Noninvasive measurements of transmural myocardial metabolites using 3-D (31)P NMR spectroscopy.", "Am J Physiology", 2001, pp. H489-H497, vol. 280, No. 1.

(Continued)

*Primary Examiner* — Dixomara Vargas
(74) *Attorney, Agent, or Firm* — Charles A. Lemaire; Lemaire Patent Law Firm, P.L.L.C.

(57) ABSTRACT

Apparatus and method that includes amplifiers for transceiver antenna elements, and more specifically to power amplifying an RF (radio frequency) signal using a distributed power amplifier having electronic devices (such as field-effect transistors) that are thermally and/or mechanically connected to each one of a plurality of antenna elements (also called coil elements) to form a hybrid coil-amplifier (e.g., for use in a magnetic-resonance (MR) imaging or spectroscopy machine), and that is optionally adjusted from a remote location, optionally including remotely adjusting its gains, electrical resistances, inductances, and/or capacitances (which controls the magnitude, phase, frequency, spatial profile, and temporal profile of the RF signal)—and, in some embodiments, the components are compatible with, and function in, high fields (such as a magnetic field of up to and exceeding one tesla or even ten tesla or more and/or an electric field of many thousands of volts per meter).

20 Claims, 10 Drawing Sheets

(56) References Cited

U.S. PATENT DOCUMENTS

| | | | |
|---|---|---|---|
| 6,396,271 B1 * | 5/2002 | Burl et al. .................... | 324/318 |
| 6,495,069 B1 | 12/2002 | Lussey et al. | |
| 6,633,161 B1 | 10/2003 | Vaughan, Jr. | |
| 6,636,037 B1 | 10/2003 | Ou-Yang | |
| 6,636,414 B2 | 10/2003 | Obert et al. | |
| 6,650,116 B2 | 11/2003 | Garwood et al. | |
| 6,788,056 B2 | 9/2004 | Vaughan et al. | |
| 6,788,057 B1 | 9/2004 | Petropoulos et al. | |
| 6,788,058 B1 | 9/2004 | Petropoulos et al. | |
| 6,888,348 B2 | 5/2005 | Kupce | |
| 6,930,480 B1 | 8/2005 | Fujita et al. | |
| 6,946,840 B1 | 9/2005 | Zou et al. | |
| 6,958,607 B2 | 10/2005 | Vaughan et al. | |
| 6,969,992 B2 | 11/2005 | Vaughan et al. | |
| 6,975,115 B1 | 12/2005 | Fujita et al. | |
| 6,977,502 B1 | 12/2005 | Hertz | |
| 6,980,002 B1 | 12/2005 | Petropoulos et al. | |
| 7,023,209 B2 | 4/2006 | Zhang et al. | |
| 7,042,222 B2 | 5/2006 | Zheng et al. | |
| 7,071,693 B2 * | 7/2006 | Yasuhara .................... | 324/319 |
| 7,084,631 B2 | 8/2006 | Qu et al. | |
| 7,088,104 B2 | 8/2006 | Bottomley | |
| 7,119,541 B2 * | 10/2006 | Barberi .................... | 324/318 |
| 7,123,012 B2 * | 10/2006 | Srinivasan .................... | 324/318 |
| 7,268,554 B2 | 9/2007 | Vaughan, Jr. | |
| 7,279,899 B2 | 10/2007 | Michaeli et al. | |
| 7,292,038 B2 * | 11/2007 | Doty .................... | 324/318 |
| 7,403,006 B2 | 7/2008 | Garwood et al. | |
| 7,436,103 B2 | 10/2008 | Kawakubo et al. | |
| 7,439,736 B2 | 10/2008 | Meaney et al. | |
| 7,514,926 B2 | 4/2009 | Vaughan et al. | |
| 7,598,739 B2 * | 10/2009 | Vaughan et al. .................... | 324/318 |
| 7,633,293 B2 | 12/2009 | Olson et al. | |
| 7,672,650 B2 | 3/2010 | Sorrells et al. | |
| 7,710,117 B2 | 5/2010 | Vaughan et al. | |
| 7,777,484 B2 | 8/2010 | Garwood et al. | |
| 7,800,368 B2 * | 9/2010 | Vaughan et al. .................... | 324/318 |
| 8,035,384 B2 * | 10/2011 | Saha .................... | 324/318 |
| 8,093,900 B2 | 1/2012 | Bennett | |
| 8,093,978 B2 | 1/2012 | Kawarai et al. | |
| 8,222,796 B2 | 7/2012 | Bhaskaran et al. | |
| 2003/0206019 A1 | 11/2003 | Boskamp | |
| 2006/0001426 A1 | 1/2006 | Vaughan et al. | |
| 2009/0115417 A1 | 5/2009 | Akgun et al. | |
| 2009/0237077 A1 | 9/2009 | Vaughan et al. | |
| 2009/0264733 A1 | 10/2009 | Corum et al. | |
| 2011/0312499 A1 | 12/2011 | Vaughan, Jr. et al. | |

OTHER PUBLICATIONS

Nelder, J.A., et al., "A simplex method for function minimization", "Comput J.", 1965, pp. 308-313, vol. 7, No. 4.

Sung K., et al., "B1+ Compensation in 3T Cardiac Imaging Using Short 2DRF Pulses", "Magnetic Resonance in Medicine", 2008, pp. 441-446, vol. 59, No. 3.

Vaughan, J.T., et al., "Clinical Imaging at 7T with a 16 Channel Whole Body Coil and 32 Receive Channels.", "Proceedings 17th Scientific Meeting, International Society for Magnetic Resonance in Medicine", Apr. 2009.

* cited by examiner

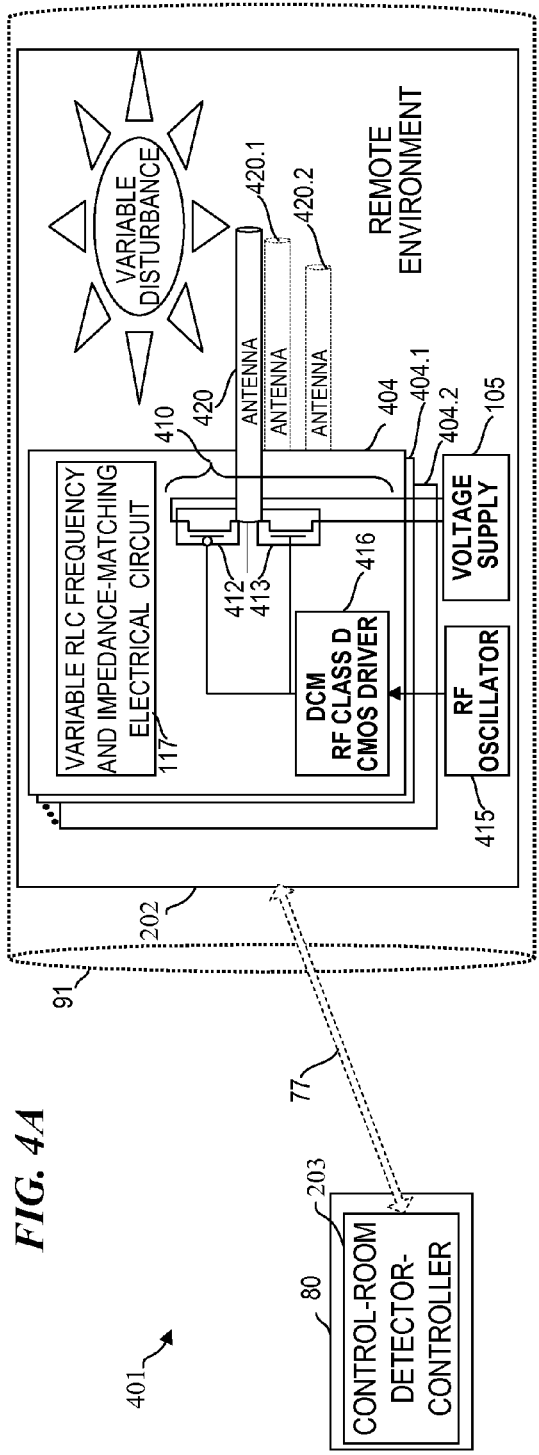
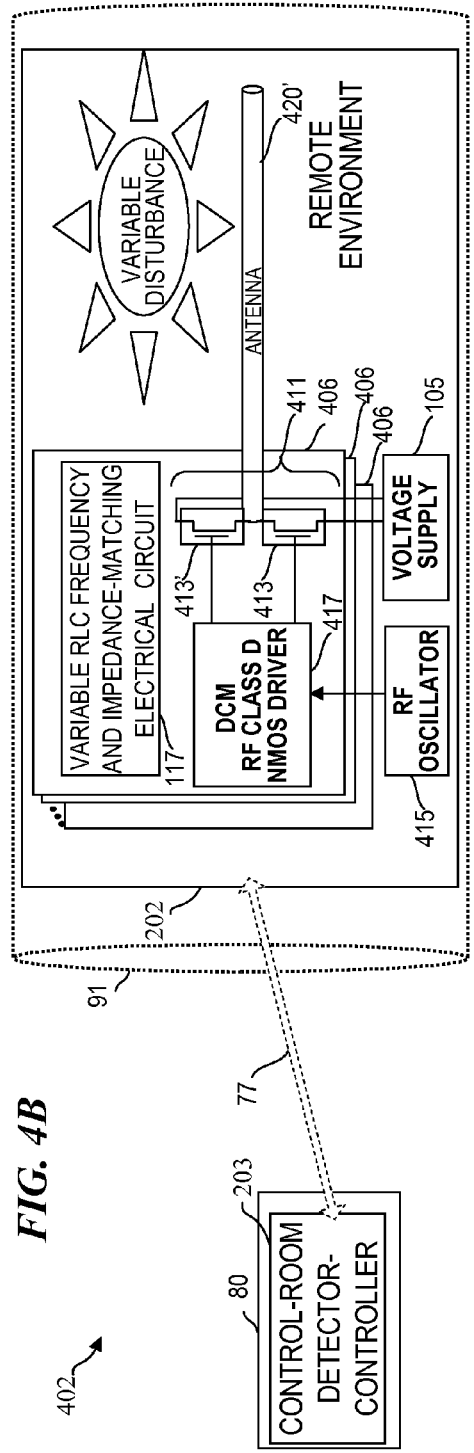
FIG. 4A
FIG. 4B

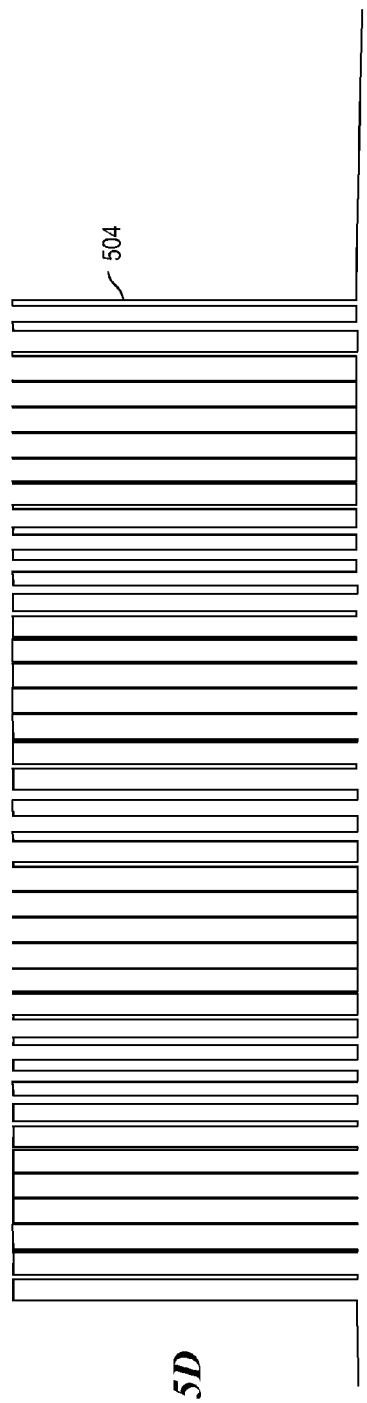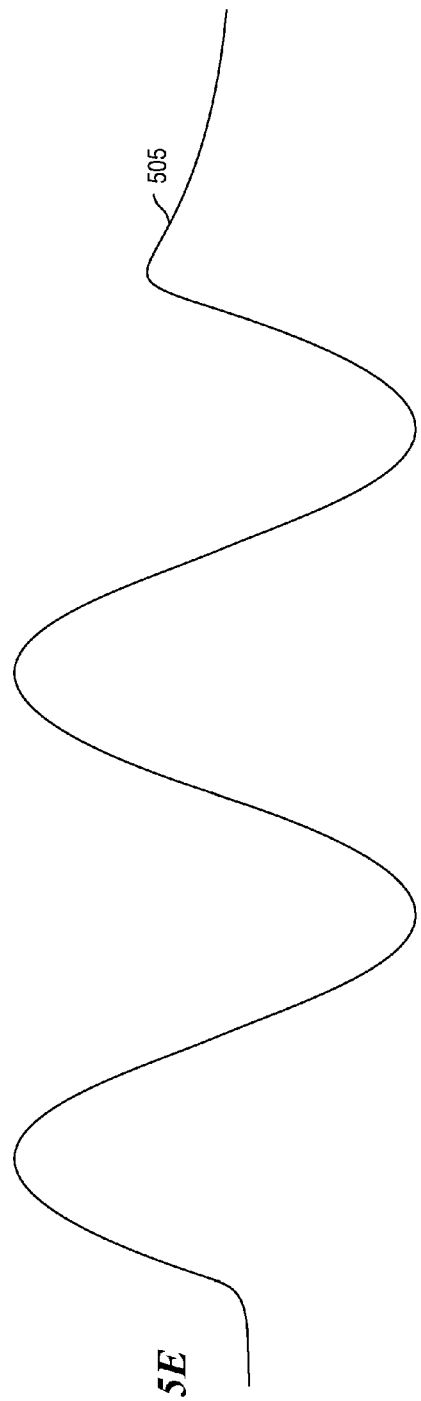
FIG. 5A
FIG. 5B
FIG. 5C
FIG. 5D
FIG. 5E

ACTIVE TRANSMIT ELEMENTS FOR MRI COILS AND OTHER ANTENNA DEVICES

FIELD OF THE INVENTION

This invention relates to the field of amplifiers for transceiver antenna elements, and more specifically to a method and apparatus for power amplifying an RF (radio frequency) signal using a distributed power amplifier having electronic devices (such as field-effect transistors) that are thermally and/or mechanically connected to each one of a plurality of antenna elements (also called coil elements) to form a hybrid coil-amplifier (e.g., for use in a magnetic-resonance (MR) imaging or spectroscopy machine), and that is optionally adjusted from a remote location, optionally including remotely adjusting its gains, electrical resistances, inductances, and/or capacitances (which controls the magnitude, phase, frequency, spatial profile, and temporal profile of the RF signal)—and, in some embodiments, the components are compatible with, and function in, high fields (such as a magnetic field of up to and exceeding one tesla or even ten tesla or more and/or an electric field of many thousands of volts per meter).

BACKGROUND OF THE INVENTION

Conventional magnetic-resonance (MR) machines (such as MR imaging (MRI) machines or MR spectroscopy (MRS) machines) employ a high-field-strength magnet (e.g., a superconducting-coil magnet having a constant (DC) magnetic field of about one tesla (1 T) or more, as well as a gradient magnet coil (which generates an additional magnetic field whose strength varies over space in a desired manner), and a radio-frequency (RF) transmit-and-receive coil device (RF-coil device) that includes a plurality of transmit-antenna elements and a plurality of receive-antenna elements. RF signal generators and RF power amplifiers are conventionally located in a control room remote from the RF-coil devices, and the RF power amplifiers have their output signals combined and then coupled to the RF-coil device via high-power-capability well-shielded coaxial cables (frequently called just "coax"). Such conventional designs typically use a plurality of medium-high power amplifiers (e.g., in some conventional circuits, each such medium-high power amplifiers is capable of outputting 500 W to 5000 W) together to amplify an RF signal, thus generating a plurality of medium-high-power RF signals (e.g., wherein the total RF power of this plurality of signals may be as high as 50 kW), and these are combined (using a combiner circuit that often incurs losses of up to 50% or more of the signal) to form a single very-high-power signal (of perhaps 30 kW, due to losses taken from the 50 kW in the plurality of medium-power signals) and then transmitted (using coaxial cables that typically incur additional losses of up to 50% or more of the signal by the time the signal is coupled to the RF-coil device in the MR magnet bore (the opening through the center of the DC magnet)). Because of the high power of the RF transmit signal, it is infeasible to wirelessly couple it from the remote control-room power amplifiers to the RF-coil device in the MR magnet bore.

U.S. patent application Ser. No. 12/719,841 titled "REMOTELY ADJUSTABLE REACTIVE AND RESISTIVE ELECTRICAL ELEMENTS AND METHOD" filed 8 Mar. 2010 by Carl Snyder et al. is incorporated herein by reference. Snyder et al. describe an apparatus and method that include providing a variable-parameter electrical component in a high-field environment and based on an electrical signal, automatically moving a movable portion of the electrical component in relation to another portion of the electrical component to vary at least one of its parameters. In some embodiments, the moving uses a mechanical movement device (e.g., a linear positioner, rotary motor, or pump). In some embodiments of the method, the electrical component has a variable inductance, capacitance, and/or resistance. Some embodiments include using a computer that controls the moving of the movable portion of the electrical component in order to vary an electrical parameter of the electrical component. Some embodiments include using a feedback signal to provide feedback control in order to adjust and/or maintain the electrical parameter. Some embodiments include a non-magnetic positioner connected to an electrical component configured to have its RLC parameters varied by the positioner.

The basis of MRI is the directional magnetic field, or moment, associated with charged particles in motion. Nuclei containing an odd number of protons and/or neutrons have a characteristic motion or precession. Because nuclei are charged particles, this precession produces a small magnetic moment. When a human body is placed in a large magnetic field, many of the free hydrogen nuclei align themselves with the direction of the magnetic field. The nuclei precess about the magnetic field direction like gyroscopes. This behavior is termed Larmor precession. The frequency of Larmor precession is proportional to the applied magnetic field strength as defined by the Larmor frequency, $\omega_0 = \gamma B_0$, where $\gamma$ is the gyromagnetic ratio and $B_o$ is the strength of the applied magnetic field. The gyromagnetic ratio is a nuclei specific constant. for hydrogen, $\gamma = 42.5$ MHz/Tesla. To obtain an MR image of an object, the object is placed in a uniform high-strength magnetic field, of between 0.5 to 1.5 Tesla. As a result, the object's hydrogen nuclei align with the magnetic field $B_0$ and create a net magnetic moment $M_0$ parallel to $B_0$. Next, a radio-frequency (RF) pulse, $B_{rf}$, is applied perpendicular to $B_0$. This pulse, with a frequency equal to the Larmor frequency, causes M to tilt away from $B_0$. Once the RF signal is removed, the nuclei realign themselves such that their net magnetic moment, M, is again parallel with $B_0$. This return to equilibrium is referred to as relaxation. During relaxation, the nuclei lose energy by emitting their own RF signal. This signal is referred to as the free-induction decay (FID) response signal. The FID response signal is measured by a conductive field coil placed around the object being imaged. This measurement is processed or reconstructed to obtain 3D MR images. (This paragraph is by Blair Mackiewich, Masters thesis, 1995)

for example, approximately 64 MHz is used for MRI machines having 1.5-Tesla magnets (these are used for most MR machine platforms in the world today), 128 MHz is used for MRI machines having 3-T magnets (currently the fastest-growing segment of the MR market), 300 MHz is used for MRI machines having 7-T magnets (considered the highest-field machines supported by industry today), 400 MHz is used for MRI machines having 9.4-T magnets (it is believed there are now only three in use in the world), and 450 MHz is used for the MRI machine having a 10.5-T magnet (currently, just the Center for Magnetic Resonance Research (CMRR) at the University of Minnesota operates one of these).

U.S. Pat. No. 4,682,125 to Harrison et al. issued Jul. 21, 1987 titled "RF coil coupling for MRI with tuned RF rejection circuit using coax shield choke" is incorporated herein by reference in its entirety for all purposes. Harrison et al. describe undesirable RF coupling via the outside of an outer coaxial cable conductor to/from RF coils in a magnetic resonance imaging apparatus is minimized by employing a parallel resonance tuned RF choke in the circuit. The choke is realized by forming a short coiled section of the coaxial cable with a lumped fixed capacitance connected in parallel thereacross and a conductive tuning rod positioned within the center of the coiled section so as to trim the parallel resonant frequency to the desired value.

U.S. Pat. No. 4,763,076 to Arakawa et al. issued Aug. 9, 1988 titled "MRI transmit coil disable switching via RF in/out cable" is incorporated herein by reference in its entirety for all purposes, and describes a detuning/decoupling arrangement for a Magnetic Resonance Imaging (MRI) system RF coil arrangement (of the typing using the nuclear magnetic resonance (NMR) phenomenon) that uses switching diodes to selectively connect and disconnect portions of an RF resonant circuit in response to a DC control signal. The DC control signal selectively forward biases and reverse biases the switching diodes. The DC control current is fed to the resonant circuit along the same RF transmission line used to feed RF signals to/from the circuit. An in-line coaxial shielded RF choke connected to the RF transmission line isolates the DC control signals from the RF signals flowing on the same transmission line—reducing the number and complexity of isolation devices required on the ends of the transmission line to separate the RF and DC signals.

Conventional MR machines and their components and operation are described in numerous patents and patent application such as U.S. Pat. No. 4,947,119 to Ugurbil et al., U.S. Pat. No. 5,908,386 to Ugurbil et al., U.S. Pat. No. 6,650,116 to Garwood et al., U.S. Pat. No. 6,788,056 to Vaughan et al., U.S. Pat. No. 6,788,057 to Petropoulos et al., U.S. Pat. No. 6,788,058 to Petropoulos et al., U.S. Pat. No. 6,930,480 to Fijita et al., U.S. Pat. No. 6,946,840 to Zou et al., U.S. Pat. No. 6,958,607 to Vaughan et al., U.S. Pat. No. 6,969,992 to Vaughan et al., U.S. Pat. No. 6,975,115 to Fujita et al., U.S. Pat. No. 6,977,502 to Hertz, U.S. Pat. No. 6,980,002 to Petropoulos et al., U.S. Pat. No. 7,042,222 to Zheng et al., U.S. Pat. No. 7,084,631 to Qu et al., U.S. Pat. No. 7,279,899 to Michaeli et al., U.S. Pat. No. 7,403,006 to Garwood et al., U.S. Pat. No. 7,514,926 to Vaughan et al., U.S. Pat. No. 7,598,739 to Vaughan et al., U.S. Pat. No. 7,633,293 to Olson et al., U.S. Pat. No. 7,710,117 to Vaughan et al., U.S. Patent Publication 2004 027128A1 to Vaughan et al., U.S. Patent Publication 2006 001426A1 to Vaughan et al., U.S. Patent Publication 2008 0084210A1 to Vaughan et al., U.S. Patent Publication 2008 0129298A1 Vaughan et al., U.S. Patent Publication 2009 115417A1 to Akgun et al., U.S. Patent Publication 2009 237077A1 to Vaughan et al., and U.S. Patent Publication 2009 0264733A1 to Corum et al.; all of which are incorporated herein by reference in their entirety for all purposes.

U.S. Pat. No. 4,947,119 to Ugurbil et al. (incorporated herein by reference in its entirety for all purposes) describes several magnetic resonance imaging (MRI) methods using adiabatic excitation. One method accomplishes slice selection with gradient-modulated adiabatic excitation. Another method employs slice selection with adiabatic excitation despite large variations in $B_1$ magnitude. There is also described $_1H$ spectroscopy using solvent suppressive adiabatic pulses.

U.S. Pat. No. 5,908,386 to Ugurbil et al. (incorporated herein by reference in its entirety for all purposes) describes contrast preparation based on Modified Driven Equilibrium fourier Transfer and generates T1 weighted images for assessment of the myocardial perfusion with contrast agent first-pass kinetics. The preparation scheme produces T1 contrast with insensitivity to arrhythmias in prospectively triggered sequential imaging.

U.S. Pat. No. 6,650,116 to Garwood et al. (incorporated herein by reference in its entirety for all purposes) describes performing MRI and NMR spectroscopy that improves the dynamic range of the received signal by using adiabatic RF pulses for spin excitation rather than for spin inversion. The preferred adiabatic RF excitation produces a spatially varying phase across the slab, and a sharp slab profile. The phase variation is divided up by a phase-encoding gradient into voxels having a phase variation that is negligible over the width of the voxel. The phase variation in the slab-select direction is, on the whole, large enough that the peak amplitude of the received signal is reduced and the signal width broadened.

U.S. Pat. No. 6,788,056 to Vaughan et al. (incorporated herein by reference in its entirety for all purposes) describes an apparatus with a radio frequency magnetic field unit to generate a desired magnetic field. In one embodiment, the radio frequency magnetic field unit includes a first aperture that is substantially unobstructed and a second aperture contiguous to the first aperture. In an alternative embodiment, the radio frequency magnetic field unit includes a first side aperture, a second side aperture and one or more end apertures. In one embodiment, a current element is removed from a radio frequency magnetic field unit to form a magnetic field unit having an aperture. In an alternative embodiment, two current elements located opposite from one another in a radio frequency magnetic field unit are removed to form a magnetic filed unit having a first side aperture and a second side aperture.

U.S. Pat. No. 6,788,057 to Petropoulos et al. (incorporated herein by reference in its entirety for all purposes) describes an MRI gradient coil set that includes a uniplanar Z-gradient coil, a biplanar X-gradient coil, and a biplanar Y-gradient coil. The coil set provides an open Z-axis face.

U.S. Pat. No. 6,788,058 to Petropoulos et al. (incorporated herein by reference in its entirety for all purposes) describes an MRI coil having an axis and a first end and an opposite second end with respect to said axis includes a first ring element at the first end, a second ring element, a third ring element, a fourth ring element at the second end where the first ring element encompasses a smaller area than each of the second, third, and fourth ring elements. The coil also includes a plurality of axial elements connected between the first, second, third and fourth ring elements. The third and fourth ring elements are axially closer than the first and second ring elements.

U.S. Pat. No. 6,930,480 to Fijita et al. (incorporated herein by reference in its entirety for all purposes) describes a partially parallel acquisition RF coil array for imaging a human head includes at least a first, a second and a third loop coil adapted to be arranged circumambiently about the lower portion of the head; and at least a forth, a fifth and a sixth coil adapted to be conformably arranged about the summit of the head. A partially parallel acquisition RF coil array for imaging a human head includes at least a first, a second, a third and a fourth loop coil adapted to be arranged circumambiently about the lower portion of the head; and at least a first and a second figure-eight or saddle coil adapted to be conformably arranged about the summit of the head.

U.S. Pat. No. 6,946,840 to Zou et al. (incorporated herein by reference in its entirety for all purposes) describes an MRI array coil includes a plurality of first coils in a receive coil array and a plurality of second coils in a transmit coil array. The receive coil array and the transmit coil array are electrically disjoint.

U.S. Pat. No. 6,958,607 to Vaughan et al. (incorporated herein by reference in its entirety for all purposes) describes a radio frequency magnetic field unit to generate a desired magnetic field. In one embodiment, the RF magnetic field unit includes a first aperture that is substantially unobstructed and a second aperture contiguous to the first aperture. In an alternative embodiment, the RF magnetic field unit includes a first side aperture, a second side aperture and one or more end apertures. In one embodiment, a current element is removed from a RF magnetic field unit to form a magnetic field unit having an aperture. In an alternative embodiment, two current elements located opposite from one another in a RF magnetic field unit are removed to form a magnetic field unit having a first side aperture and a second side aperture.

U.S. Pat. No. 6,969,992 to Vaughan et al. (incorporated herein by reference in its entirety for all purposes) describes an excitation and detection circuit having individually controllable elements for use with a multi-element RF coil. Characteristics of the driving signal, including, for example, the phase, amplitude, frequency and timing, from each element of the circuit is separately controllable using small signals. Negative feedback for the driving signal associated with each coil element is derived from a receiver coupled to that coil element.

U.S. Pat. No. 6,975,115 to Fujita et al. (incorporated herein by reference in its entirety for all purposes) describes a partially parallel acquisition RF coil array for imaging a sample includes at least a first, a second and a third coil adapted to be arranged circumambiently about the sample and to provide both contrast data and spatial-phase-encoding data.

U.S. Pat. No. 6,977,502 to Hertz (incorporated herein by reference in its entirety for all purposes) describes a configurable matrix receiver comprises a plurality of antennas that detect one or more signals. The antennas are coupled to a configurable matrix comprising a plurality of amplifiers, one or more switches that selectively couple the amplifiers in series fashion, and one or more analog-to-digital converters (ADCs) that convert the output signals generated by the amplifiers to digital form. for example, in one embodiment, a matrix comprises a first amplifier having a first input and a first output, and a second amplifier having a second input and a second output, a switch to couple the first output of the first amplifier to a the second input of the second amplifier, a first ADC coupled to the first output of the first amplifier, and a second ADC coupled to the second output of the second amplifier. In one embodiment, the signals detected by the antennas include magnetic resonance (MR) signals.

U.S. Pat. No. 6,980,002 to Petropoulos et al. (incorporated herein by reference in its entirety for all purposes) describes an MRI array coil for imaging a human includes a posterior array, an anterior torso array and an anterior head-neck-upper-chest array. The head-neck-upper-chest array has a head portion mountable to the anterior array and a neck-upper-chest portion hingingly attached to the head portion.

U.S. Pat. No. 7,042,222 to Zheng et al. (incorporated herein by reference in its entirety for all purposes) describes a phased-array knee coil that includes a transmit coil array and a receive coil array having a plurality of coils configured to provide a first imaging mode and a second imaging mode.

U.S. Pat. No. 7,084,631 to Qu et al. (incorporated herein by reference in its entirety for all purposes) describes an MRI array coil system and method for breast imaging. The MRI array coil system includes a top coil portion with two openings configured to receive therethrough objects to be imaged. The MRI array coil system further includes a bottom coil portion having two openings configured to access from sides of the bottom coil portion the objects to be imaged. The top coil portion and bottom coil portion each have a plurality of coil elements configured to provide parallel imaging.

U.S. Pat. No. 7,279,899 to Michaeli et al. (incorporated herein by reference in its entirety for all purposes) describes modulating transverse and longitudinal relaxation time contrast in a rotating frame based on a train of RF pulses.

U.S. Pat. No. 7,403,006 to Garwood et al. (incorporated herein by reference in its entirety for all purposes) describes magnetic resonance that uses a frequency-swept excitation wherein the acquired signal is a time domain signal is provided. In one embodiment, the sweeping frequency excitation has a duration and is configured to sequentially excite isochromats having different resonant frequencies. Acquisition of the time domain signal is done during the duration of the sweeping frequency excitation. The time domain signal is based on evolution of the isochromats.

U.S. Pat. No. 7,514,926 to Adriany et al. (incorporated herein by reference in its entirety for all purposes) describes a coil having a plurality of resonant elements and an adjustable frame. A position of at least one resonant element can be adjusted relative to at least one other resonant element. A variable impedance is coupled to adjacent resonant elements and the impedance varies as a function of a separation distance. Cables are coupled to each resonant element and are gathered at a junction in a particular manner.

U.S. Pat. No. 7,598,739 to Vaughan et al. (incorporated herein by reference in its entirety for all purposes) describes a plurality of linear current elements configured about a specimen to be imaged. A current in each current element is controlled independent of a current in other current elements to select a gradient and to provide radio frequency shimming. Each current element is driven by a separate channel of a transmitter and connected to a separate channel of a multi-channel receiver. The impedance, and therefore, the current, in each current element is controlled mechanically or electrically.

U.S. Pat. No. 7,633,293 to Olson et al. (incorporated herein by reference in its entirety for all purposes) describes technology for controlling non-uniformity in the $B_1$ field includes selecting the phase, magnitude, frequency, time, or spatial relationship among various elements of a multi-channel excitation coil in order to control the radio frequency (RF) power emanating from the coil antenna elements. Non-uniformity can be used to steer a constructively interfering $B_1$ field node to spatially correlate with an anatomic region of interest. A convex (quadratically constrained quadratic problem) formulation of the $B_1$ localization problem can be used to select parameters for exciting the coil. Localization can be used in simulated Finite Difference Time Domain $B_1$ field human-head distributions and human-head-phantom measurement.

U.S. Pat. No. 7,710,117 to Vaughan et al. (incorporated herein by reference in its entirety for all purposes) describes a current unit having two or more current paths that allows control of magnitude, phase, time, frequency and position of each of element in a radio frequency coil. for each current element, the current can be adjusted as to a phase angle, frequency and magnitude. Multiple current paths of a current unit can be used for targeting multiple spatial domains or strategic combinations of the fields generated/detected by combination of elements for targeting a single domain in magnitude, phase, time, space and frequency.

U.S. Patent Publication 2008 0129298A1 to Vaughan et al. (incorporated herein by reference in its entirety for all purposes) describes multi-channel magnetic resonance using a TEM coil.

U.S. Patent Publication 2009 0115417A1 to Akgun et al. (incorporated herein by reference in its entirety for all purposes) describes an RF having a plurality of transmission line elements, wherein at least one of the plurality of transmission line elements may have at least one dimension different than a dimension of another one of the plurality of transmission line elements. In some cases, each of the transmission line elements may include a signal line conductor and a ground plane conductor separated by a dielectric.

U.S. Patent Publication 2009 0237077A1 to Vaughan et al. (incorporated herein by reference in its entirety for all purposes) describes an RF coil system for MR applications that includes a multi-channel RF coil transceiver and a multi-channel RF coil. The RF coil system is structured for reconfiguration between a plurality of operational modes.

U.S. Patent Publication 2009 0264733A1 to Corum et al. (incorporated herein by reference in its entirety for all purposes) describes a positive contrast MRI feature using a high transverse relaxation rate contrast agent.

U.S. Pat. No. 6,495,069 issued Dec. 17, 2002 to Lussey et al. titled "Polymer composition," is incorporated herein by reference. Lussey et al. describe a polymer composition comprises at least one substantially non-conductive polymer and at least one electrically conductive filler and in the form of granules. Their elastomer material was proposed for devices for controlling or switching electric current, to avoid or limit disadvantages such as the generation of transients and sparks which are associated with the actuation of conventional mechanical switches. They described an electrical conductor composite providing conduction when subjected to mechanical stress or electrostatic charge but electrically insulating when quiescent comprising a granular composition each granule of which comprises at least one substantially non-conductive polymer and at least one electrically conductive filler and is electrically insulating when quiescent but conductive when subjected to mechanical stress. They did not propose a means for electrically activating such switches.

U.S. Pat. No. 7,672,650 to Sorrells et al. issued Mar. 2, 2010 titled "Systems and methods of RF power transmission, modulation, and amplification, including multiple input single output (MISO) amplifier embodiments comprising harmonic control circuitry" and is incorporated herein by reference. Sorrells et al. describe methods and systems for vector combining power amplification. In one embodiment, signals are individually amplified, then summed to form a desired time-varying complex envelope signal. Phase and/or frequency characteristics of one or more of the signals are controlled to provide the desired phase, frequency, and/or amplitude characteristics of the desired time-varying complex envelope signal. In another embodiment, a time-varying complex envelope signal is decomposed into a plurality of constant envelope constituent signals. The constituent signals are amplified equally or substantially equally, and then summed to construct an amplified version of the original time-varying envelope signal. Embodiments also perform frequency up-conversion. However, neither operation in high fields nor operation where the control of the circuit is distal from the RF antennae, are discussed by Sorrells et al.

As used herein, an antenna (also called a coil element herein) is an electrically conductive elongate body that is connected to an electric circuit, and that (1) transmits (radiates) electromagnetic radiation (radio-frequency (RF) waves that propagate without a physical electrical conductor) corresponding to an alternating current (AC) radio-frequency signal from the circuit, wherein the transmitted RF waves propagate into the surrounding environment away from the coil element, and/or that (2) receives electromagnetic radiation (radio waves) from the environment and generates an AC radio-frequency electrical signal into the circuit. Coil elements can be simply a straight, bent, or coiled piece of metal wire or rod or pipe, or a similarly shaped conductor on an insulating substrate. There are a number of different types of antennae, including monopoles, dipoles, microstrips, striplines and slot antennae just to name a few, and various of these types of antennae can be formed into arrays (e.g., phased arrays) to customize the shape and strength of the resulting RF field. As used herein, an "RF-coil device" or an "antenna array" are equivalent terms for an array of coil elements (i.e., an array having a plurality of antennae). To clarify the distinction from an inductor (i.e., an inductor which typically includes a coil of wire for lower frequencies, and which is sometimes simply called a coil) that is not being used as an antenna, such inductors will be called herein "inductor coils" or simply "inductors". In some embodiments, the RF-coil device is an MR-RF-coil device that is configured to be used in a high-field MR machine (i.e., it is made of non-ferrous materials and is otherwise compatible with the magnetic and RF fields typically found in such machines) and forms an essential part of the MR machine (such as an MRI machine used to obtain images of structures inside the human body).

In conventional MR machines, there is less concern with compatibility of the high-power RF amplifiers to a high-magnetic-field environment because in conventional MR machines the high-power RF amplifiers are located in a control room, and are at a distance from the remote antenna array located in the magnet bore next to the patient.

There is a long-felt need for a more efficient and flexible way to obtain and connect high-power RF signals to one or more antenna arrays in an MR machine. This need also applies to other high-power RF-transmit-antennae signals.

SUMMARY OF THE INVENTION

The present invention provides a more efficient and flexible way to obtain and connect high-power RF signals to RF-coil devices in an MR machine by providing transmitter power amplifiers and/or receiver pre-amplifiers that are distributed and connected directly to the coil elements in and/or at the RF-coil device. This solution also applies to other high-power RF-transmit-antennae signals.

In some embodiments of the present invention, one or more active electronic devices (e.g., semiconductor devices such as field-effect transistors, positive-intrinsic-negative (PIN) diodes, varactors (electronically variable capacitance devices), and the like) are mounted to (e.g., physically on or immediately adjacent to) a plurality of coil elements of an antenna array. In some such embodiments, the active electronic devices are thermally coupled directly to the antenna elements. By moving the power-amplifier circuitry from its conventional location somewhat distal to the coil-element array (also called the antenna array), to instead both locate the power-amplifier circuitry on the plurality of coil elements and distribute the amplifiers across the plurality of coil elements, a number of advantages are obtained, including:
  fewer and lower-power power amplifiers can be used because the losses in the combiner and coaxial cable (frequently called just "coax") are avoided (this also reduces cost and reduces failure rates by eliminating the combiners and coaxial cabling),
  wireless connections (and/or much smaller gauge cabling) can be used for transmit signals, as well as for receive signals, since only low-power RF transmit signals and control signals need be sent from the control room to the RF-coil device in the magnet bore,
  the coil elements provide a convenient heat-sink platform for handling the waste heat of the power amplifiers, there is more room around the patient, reducing the claustrophobic feeling that otherwise results from the massive cabling otherwise needed, and locating the power amplifiers and/or the transmit/receive (T/R) switches in the coil enclosure provides increased flexibility in circuit layout and coil-element positioning, and allows additional functionality (such as automatic tuning and impedance matching) to be provided for the transmit circuitry and the T/R switching circuitry.

Other advantages will become apparent to those skilled in the art upon reading the following detailed description of various embodiments.

In some embodiments, the present invention uses RF signals having frequencies in the range of 50 MHz to 500 MHz. In MR machines of different magnetic-field strengths, different RF frequencies are used, wherein the frequency corresponds to a nuclear resonance at a given magnetic-field strength; for example 64 MHz is used for MRI machines having 1.5-Tesla magnets (these are used for most MR machine platforms in the world today), 128 MHz is used for MRI machines having 3-T magnets (currently the fastest-growing segment of the MR market), 300 MHz is used for MRI machines having 7-T magnets (considered the highest-field machines supported by industry today), 400 MHz is used for MRI machines having 9.4-T magnets (it is believed there are now only three in use in the world), and 450 MHz is used for the MRI machine having a 10.5-T magnet (currently, just the Center for Magnetic Resonance Research (CMRR) at the University of Minnesota operates one of these).

In some embodiments, the present invention uses a plurality of Class AB power amplifiers (e.g., each having an output stage that includes a pair of push-pull transistors that are biased to reduce the cross-over distortion that otherwise may occur as the AC signal crosses from being amplified by one of the transistors to being amplified by the other transistor). Each of a plurality of transmit coil elements has its own power amplifier, thus distributing the power-amplifier output circuitry around the coil. Class AB power amplifiers suffer inefficiencies due to the fact that for significant portions of each AC RF cycle, both transistors are partially conducting.

To avoid such inefficiencies associated with Class AB power amplifiers, some other embodiments of the present invention instead use a plurality of Class D power amplifiers to power amplify the Larmor-frequency excitation RF pulse. Class D amplifiers use duty-cycle modulation (e.g., pulse-width modulation (PWM)) signals to drive a push-pull pair of transistors. Other than during a very brief moment during switching, only one of the pair of transistors is "ON" while the other is "OFF," which leads to the higher efficiencies of such power amplifiers. Typically the switching frequency is up to ten times higher than the frequency that is to be transmitted, and the tuned circuit that the coil element is part of will eliminate the higher switching-frequency components of the output, leaving just the desired RF transmit frequency. for example, in some embodiments, to obtain a 128-MHz RF signal used for a 3-T MRI machine, a PWM digital signal having a 1.28-GHz switching frequency (the pulse rate of the PWM source signal) may be coupled to a CMOS pair of FETs, and the output circuitry is tuned as a bandpass filter having a center frequency of 128 MHz, which eliminates the PWM-signal's 1.28-GHz-and-higher frequency components, thus leaving the desired 128-MHz signal. for another example, in some embodiments, to obtain a 400-MHz RF signal used for a 9.4-T MRI machine, a PWM digital signal having a 4-GHz switching frequency may be coupled to a CMOS pair of FETs, and the output circuitry is tuned as a bandpass filter having a center frequency of 400 MHz, which eliminates the 4-GHz-and-higher frequency components, thus leaving the desired 400-MHz signal. Since regular small Ethernet cabling that supports one gigabit/second signaling is readily available and Ethernet cabling that supports ten gigabit/second signaling is now becoming available, one can see that very little cabling is needed to send the necessary signals from the control room to the circuitry incorporated in the RF coil in the magnet bore.

In some embodiments, the circuitry incorporated in the RF coil in the magnet bore further includes the RF oscillators needed for the transmit signals, and thus only control signals need be sent from the control room to the RF coil in the magnet bore, further reducing bandwidth requirements, and facilitating even wireless control of the RF transmit signal. In some embodiments, wireless transmission is also used for the signals received by the RF-coil device, and thus the only wiring needed in some embodiments is electrical-power cabling (e.g., in some embodiments, cabling for DC voltage and current) that is used to supply electrical power to the power amplifiers of the transmit stages, the T/R switches, and the pre-amplifiers of the receive stages. In some such embodiments, cooling water is also sent to the RF-coil device to provide additional cooling capability. In other embodiments, forced air is flowed through the magnet bore to cool the power amplifier/coil element-heat sinks, which provides the additional advantage of providing patient comfort.

In some embodiments, the distributed-power-amplifier apparatus of the present invention also includes resistors, inductors, capacitors, and/or antenna elements that have their electrical-circuit values controlled by one or more electrically controlled non-magnetic mechanical movement devices (such as linear positioners or rotary motors (which move a solid material), or pumps (which move a liquid or gas)). In some embodiments, the electrically controlled mechanical movement devices (such as piezo-electrical linear motors, micro-electronic mechanical-system (MEMS) mechanical actuators or MEMS pumps) and other elements (which are used to make the resistors, inductors, capacitors, and/or antenna elements) include metals that have only substantially non-magnetic components such that the resistors, inductors, capacitors, robotic arms or similar mechanical devices, and/or antenna elements and the mechanical positioner(s) or pump(s) that adjust their variable values can be placed and operated within and/or near an extremely high electric field of many thousands of volts per meter (such as connected to or affecting electricity-transmission lines carrying hundreds of thousands of volts and very large currents), or extremely-high magnetic field such as within the very strong superconducting-wire magnets of high-energy particle-physics experiments (such as the Large Hadron Collider) or within magnets of a magnetic-resonance imaging machines, or during and after an electromagnetic pulse (EMP) from a nuclear event.

BRIEF DESCRIPTION OF THE DRAWINGS

FIG. 4A is a block diagram of a variable antenna subsystem 401 driven by a pair of FETs having the complementary polarities (i.e., P-type and N-type) according to one embodiment of the present invention, wherein variable antenna 420 is set to a first length.

FIG. 4B is a block diagram of variable antenna subsystem 402 driven by a pair of FETs having the same polarity (e.g., both N-type in some embodiments) according to one embodiment of the present invention, wherein variable antenna 420 is set to a second length.

FIG. 5A shows the waveforms of a control pulse used in some embodiments to obtain a PWM seed signal.

FIG. 5B shows the waveforms of an RF sine-wave seed signal and a gated higher-frequency triangle or saw-tooth wave use in some embodiments to obtain a PWM seed signal.

FIG. 5C shows the waveform of a PWM seed signal.

FIG. 5D shows the waveform of an amplified PWM signal.

FIG. 5E shows the waveform of a filtered amplified RF sine-wave signal.

DESCRIPTION OF PREFERRED EMBODIMENTS

Although the following detailed description contains many specifics for the purpose of illustration, a person of ordinary skill in the art will appreciate that many variations and alterations to the following details are within the scope of the invention. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

As used herein, a non-magnetic mechanical movement device is any electrically-controlled device (such as a linear positioner, rotary motor, or pump) made of materials that do not move (or move to a substantially negligible amount) due to a high magnetic field when subjected to the high magnetic field. Such devices can be placed within the high magnetic field of a magnetic-resonance machine or the superconducting magnet of a particle accelerator without the danger of the device moving due to the magnetic field and/or without the undesirable result of changing the magnetic field due to their presence. In many of the descriptions herein, the term "motor" (such as motor 140) will be used as an example of such a non-magnetic mechanical movement device, however one of skill in the art will recognize that in other embodiments, the "motor" can be implemented as a linear or rotary motor device using suitable linkages, or as a pump that uses a liquid or pneumatic fluid to effectuate the described movement.

Figure 1A:
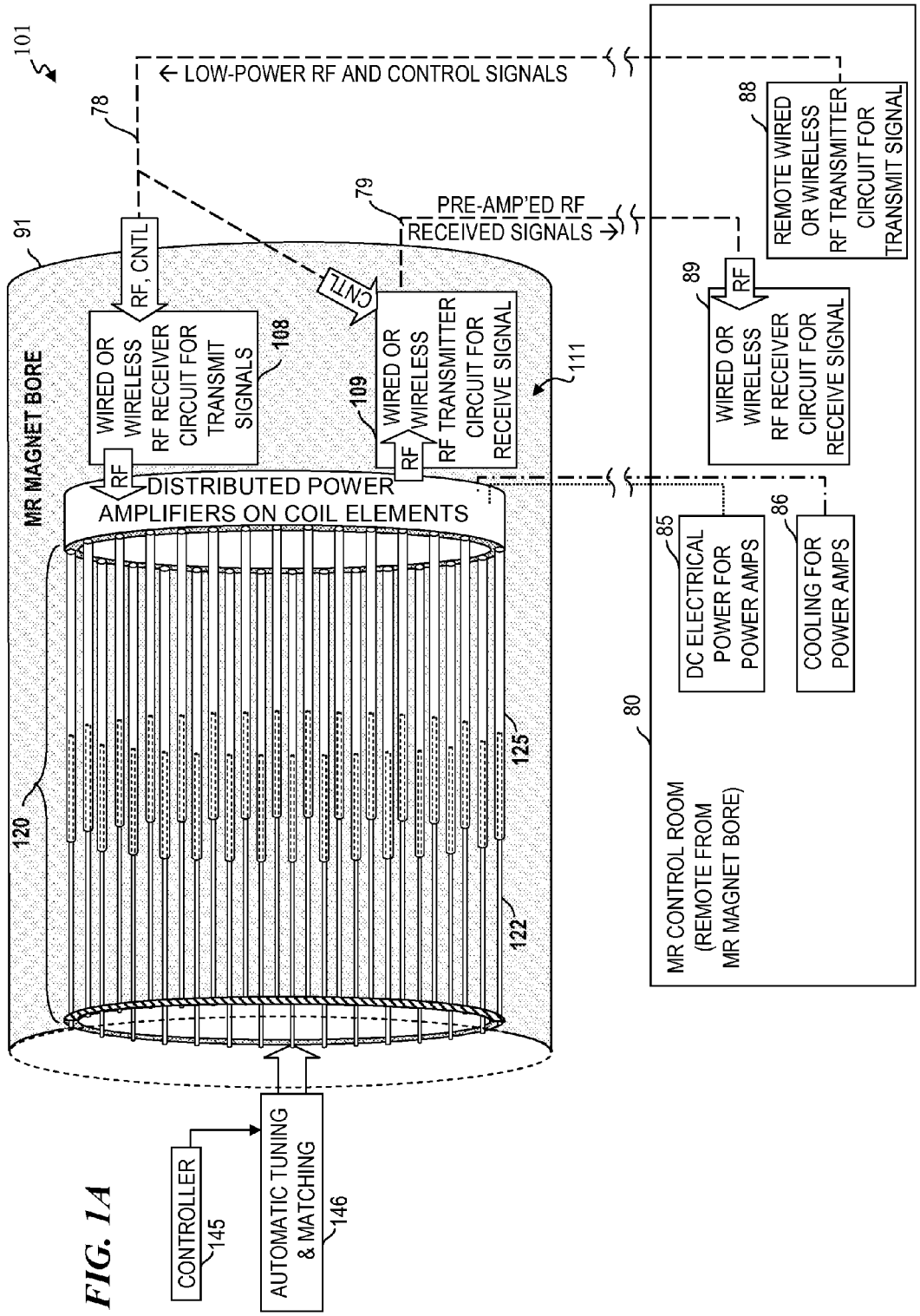
FIG. 1A is a block diagram of a distributed-power-amplifier subsystem 101 having a plurality of remote power amplifiers 108 connected to a plurality of remote antenna elements 120 and controlled from a remote control room 80, according to one embodiment of the present invention.

FIG. 1A is a block diagram of a distributed-power-amplifier subsystem 101 having a plurality of remote power amplifiers 108 connected to a plurality of remote antenna elements 120 and controlled from a distal control room 80, according to one embodiment of the present invention. In some embodiments, a controller 145 controls automatic frequency tuning and impedance matching (FIM) unit 146 (which controls impedances and resonance frequency of the antenna elements 120 (e.g., in some embodiments, each antenna element's length is adjustable by extending an inner tube or rod 122 from an outer tube 125). In some embodiments, low-power RF and/or control signals 78 are generated in the distal control room (i.e., outside the magnet room and away from the magnet bore 91) by circuit 88. In some embodiments, these signals 78 are carried by coax, Ethernet cable, optical fibers, and/or wirelessly. In some embodiments, signals 78 include control signals (shown as CNTL) to control the switching between transmit mode and receive mode. The received signals 79 from the antenna elements are obtained by preamplifiers and receive circuit 109, and carried to outside the magnet room to a receiver circuit 89 (e.g., in control room 80). In some embodiments, control room 80 supplies electrical power (from source 85) and/or cooling fluid or air from source 86, which power and cool the components in the hybrid coil unit 111 having the distributed amplification of the RF transmit pulses.

Figure 1B:
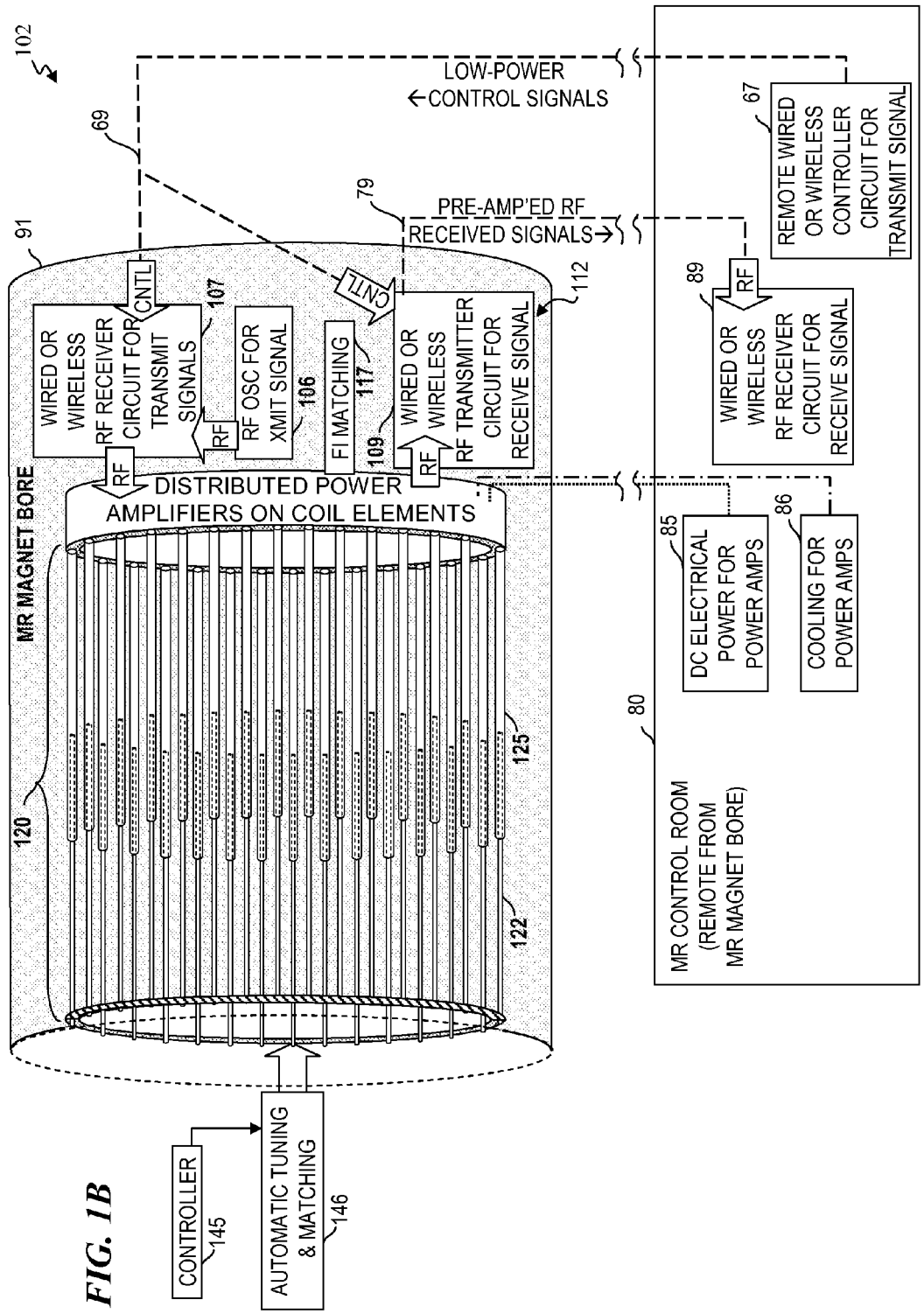
FIG. 1B is a block diagram of a system 102 having a distributed-power-amplifier subsystem 112 having a plurality of remote power amplifiers 107 that are driven by a remote RF oscillator 106 connected to a plurality of remote antenna elements 120 and controlled from a remote control room 80, according to one embodiment of the present invention.

FIG. 1B is a block diagram of a system 102 having a distributed-power-amplifier subsystem 112 having a plurality of remote power amplifiers 107 that are driven by a remote RF oscillator 106 connected to a plurality of remote antenna elements 120 and controlled from a remote control room 80, according to one embodiment of the present invention. In some embodiments, the system 102 of FIG. 1B is substantially similar to system 101 of FIG. 1A, except that the RF transmit signals are generated, synthesized, or sequenced in the remote coil unit 112 (which replaces coil unit 111 of FIG. 1A). The transmit control signals 69 are generated and controlled from control circuit 67. The RF transmit signal is generated by circuit 106 in the remote coil unit 112 under control of control signals 69, and drive the output stage of the distributed amplifiers 107. The received RF signals 79 from circuit 109 again go to the receive circuit 89, and are then processed in a conventional manner to obtain the spectroscopy or image data.

Figure 1C:
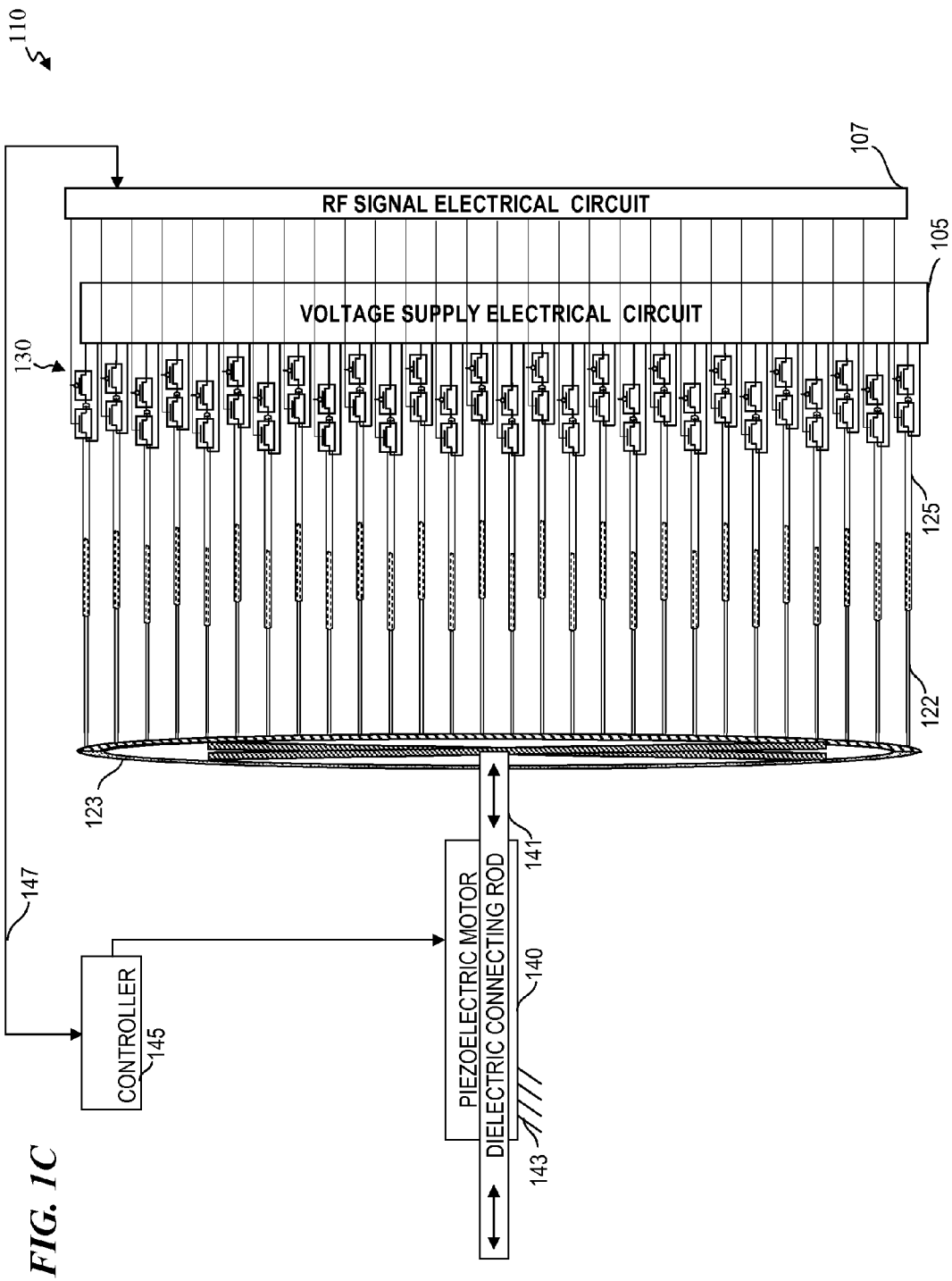
FIG. 1C is a block diagram of a distributed-power-amplifier subsystem 110 having a plurality of remote power amplifiers 130 that are driven by a remote RF circuit 109 and connected to a plurality of remote antenna elements 120, according to one embodiment of the present invention.

FIG. 1C is a block diagram of a distributed-power-amplifier subsystem 110 having a plurality of remote power amplifiers 130 that are driven by a remote RF circuit 107 and connected to a plurality of remote antenna elements 120, according to one embodiment of the present invention. In some embodiments, the push-pull circuitry 130 implements a Class AB transmit output stage; while in other embodiments, it implements a Class D (e.g., PWM) transmit output stage. In some embodiments, the automatic tuning and matching of unit 146 (see FIG. 1A) is implemented using a piezo motor 140 coupled to a reference spatial location 143, and operating a mechanical arm of a dielectric material 141, as described in U.S. patent application Ser. No. 12/719,841 by Carl Snyder et al., which is incorporated herein by reference. In some embodiments, a power supply 105 provides the electrical power to the push-pull output stage 130, while RF driver circuit 107 provides the drive signals. Other aspects are as described above.

Figure 1D:
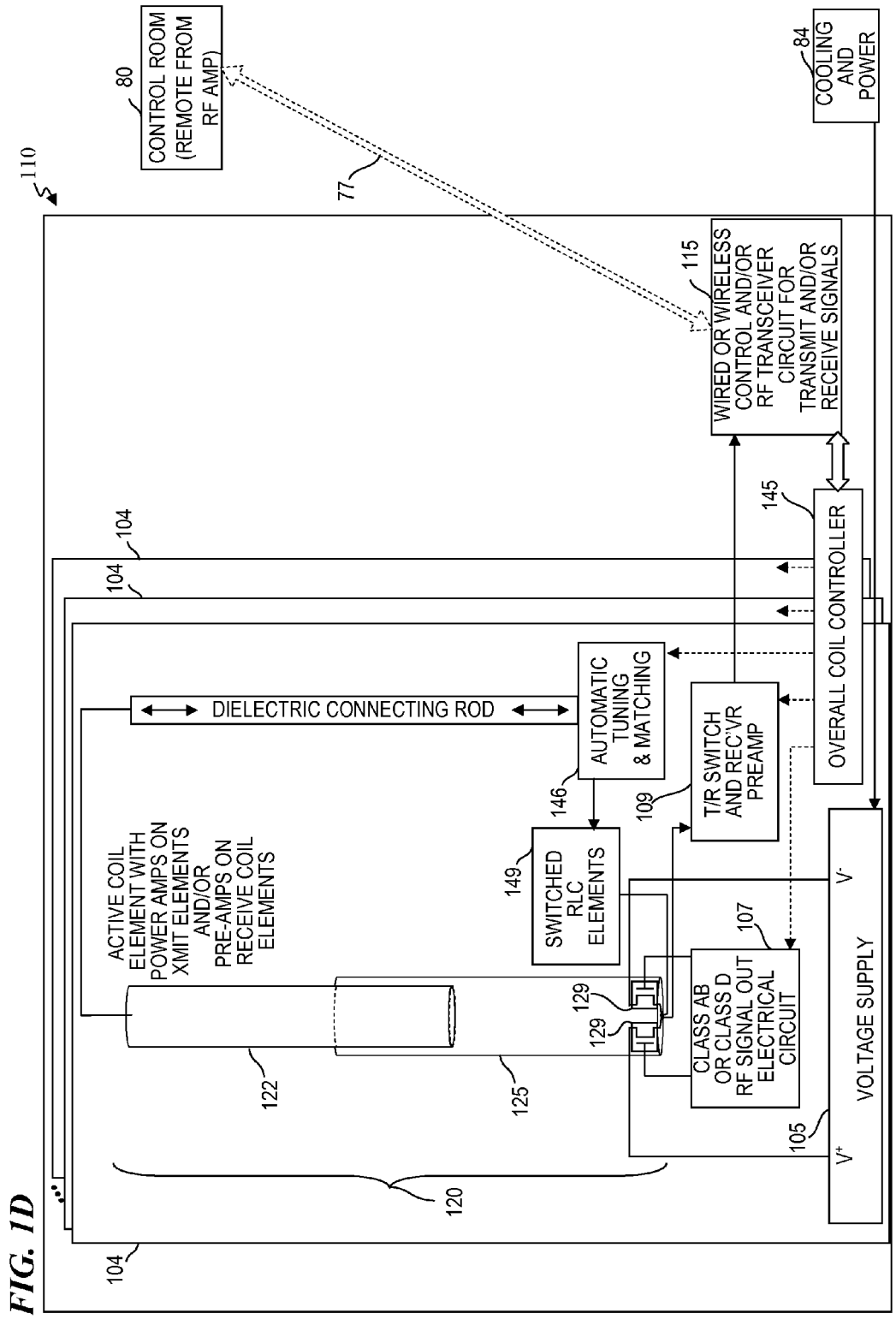
FIG. 1D is a block diagram of a distributed-power-amplifier subsystem 110 having a plurality of remote power amplifier-antenna portions 104 that each include one or more amplifying components 129 (e.g., FETs or other transistors) and each connected to one of the plurality of remote antenna elements 120, according to one embodiment of the present invention.

FIG. 1D is a block diagram of a distributed-power-amplifier subsystem 110 having a plurality of remote power amplifier-antenna portions 104 that each include one or more amplifying components 129 (e.g., FETs or other transistors) and each connected to one of the plurality of remote antenna elements 120, according to one embodiment of the present invention. In some embodiments, each power-amplifier-antenna portion 104 obtains electrical power from a voltage supply 105, and drive signals from a Class D driver circuit 107. FETs 129, in some embodiments, are CMOS pairs, while in other embodiments, FETs having the same polarity type are used. In some embodiments, FETs 129 are mounted on the base part 125 of antenna 120, which also includes a movable part 122 (as described above and shown in FIG. 1A). In some embodiments, overall coil controller 145 operates the circuitry shown under control of a signal 77 received through wired or wireless control and/or RF transceiver circuit 115 from a distal circuit in control room 80 outside the magnet room. In some embodiments, FIM circuitry 149 includes a plurality of switched resistance, inductance and/or capacitance (RLC) circuitry to match the frequency and impedance desired. In some embodiments, an automatic tuning circuit 146 controls the operation of the antenna adjustment rod (controlling the length of the antenna 125-122) and the PIN-switched RLC elements 149 that are coupled to the various parts and transmission lines in each portion 104. In some embodiments, the transmit/receive (T/R) switch and preamplifier 109 receives the resulting relaxation signal from the antenna element(s) and provides parallel wired or fiber-optic output signals 77 (through wired or wireless control and/or RF transceiver circuit 115, which is used for transmit and/or receive signals) to the control room 80. In some embodiments, cooling and power 84 are supplied from outside the magnet room.

Figure 2:
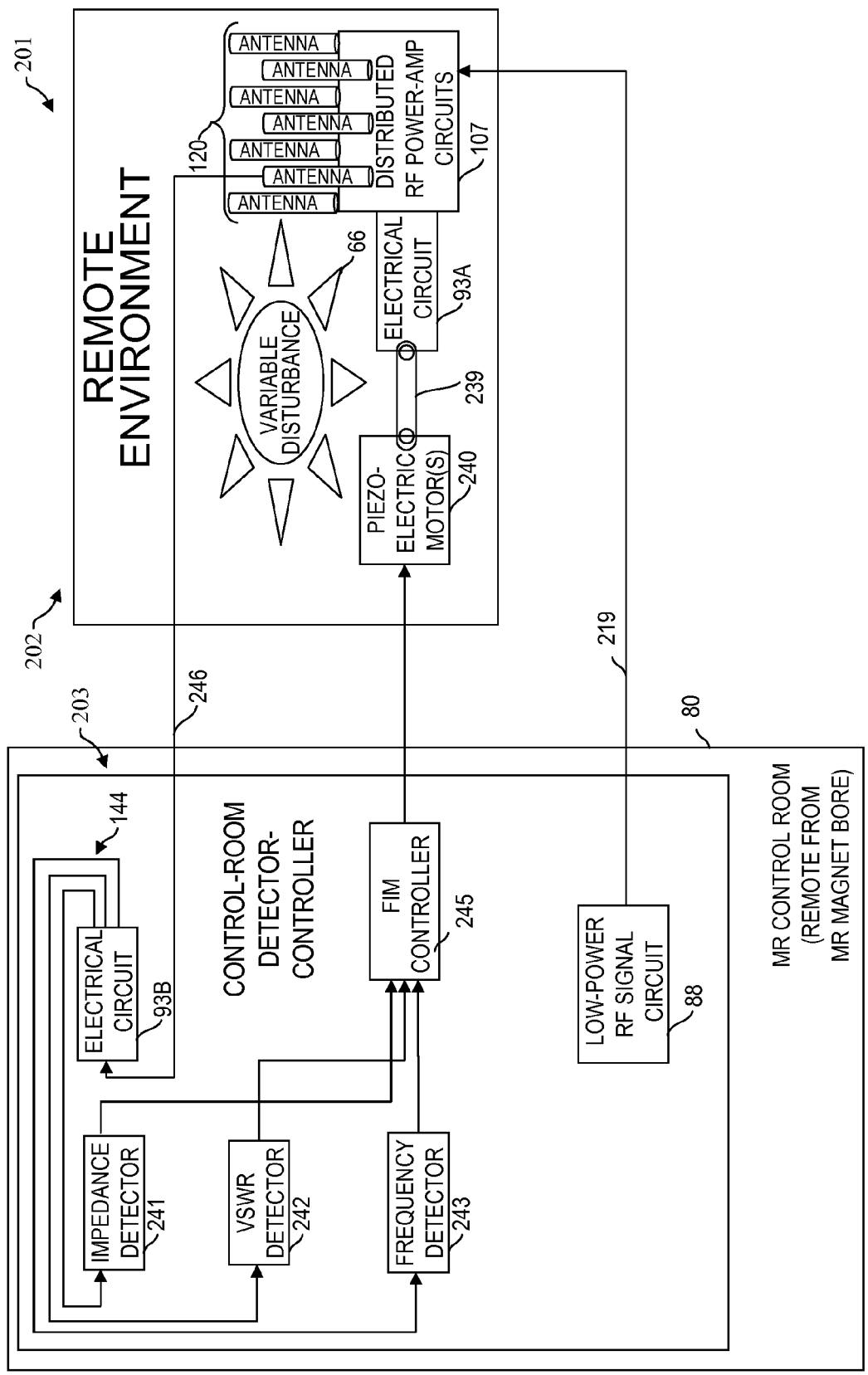
FIG. 2 is a block diagram of an entire system 201 according to one embodiment of the present invention, wherein variable electrical components of circuits 93A and/or 93B are controlled to parameters set by controller 203.

FIG. 2 is a block diagram of an entire system 201 according to one embodiment of the present invention, wherein variable electrical components of circuits 93A and/or 93B (particularly those in the portion labeled 93A in a remote environment 202) are controlled to values set by controller 245. In some embodiments, the frequency-impedance-matching (FIM) circuit has two portions, a first portion 93A that is remote (i.e., located at a distance, e.g., in the high-field magnet located at a distance from the control room 80 of an MRI system) from a second portion 93B (e.g., the portion located in the control room 80). In some embodiments, remote circuit portion 93A is coupled to circuit portion 93B by a transmission line 219 (having a characteristic impedance Z at a given operating frequency or spectrum) such as a coaxial cable. In conventional systems, the frequency and impedance of the remote antenna array would need to be matched to the impedance of the coax cable 219. However, in some embodiments of the present invention, the remote distributed amplifier 107 provides a buffer, wherein the signal coming from the distal control room 80 and through the cable 219 sees only the input impedance of the amplifier and the effect of the variable disturbance on that impedance is negligible or substantially zero. Thus, even in embodiments having the RF-transmit signal generated in the distal control room 80, there is less of a requirement to match impedance of the coax cable 219 due to changes in the variable disturbance (e.g., the variations of patient weight, size, or composition). Further, in some embodiments, the signal sent across cable 219 is a duty-cycle-modulated (DCM) signal (in some embodiments, the DCM signal is a pulse-width-modulated (PWM) signal, while in other embodiments, pulses having a substantially unchanging pulse width but having a variable frequency, or other DCM characteristic are used). In still other embodiments, the signals on cable 219 include relatively low-frequency control signals (e.g., digital pulses that control the timing and duration of the transmitted RF pulses and the switching operations that control reception of the resulting RF response from the subject in the MR magnet, for example that control operation of an RF oscillator and pulse generator that are both in the remote device 202, and switching PIN-diodes that isolate the RF-reception preamps of the receive portion of the remote device 202).

In some embodiments, controller 203 is well outside of the remote environment 202 (such as a high magnetic field enclosure, or a broadcast television antenna on a tower, or a remote weather sensor) that includes circuit portion 93A and its RLC components controlled by piezo motor 240 and/or its controller rod 239. In other embodiments, both portions 93A and 93B of the circuit (which includes both circuit portions 93A and 93B, as well as the FIM controller 245 and its impedance detector 241, VSWR detector 242, and frequency detector 243) are in the remote location in device 202. The FIM controller 245 provides the control signals that vary the antenna length(s) of antenna 120 and/or the variable R, L, and/or C values in circuit 93A, in order to match the desired resonance frequency of the RF transmitter to the desired transmit frequency (which, in some embodiments, is determined by the PWM signal that is Class-D amplified and filtered to form the RF transmit pulse). In some embodiments, electrical circuit 93A includes a radio-wave transmitter, receiver, or both (including the distributed power amplifier circuits 107 and antennae 120).

One use of the present invention is to provide remote amplification of the transmit RF pulse (e.g., a plurality of cycles of an RF signal gated by a signal that determines the length of the pulse (i.e., how many RF cycles are transmitted)) and to balance (match the resonance frequency and impedance) an RLC circuit (that includes antenna elements) wherein the inductance and/or capacitance parameters of at least a portion of the RLC circuit is affected by an external and variable disturbance 66 such as weather conditions or a conductive and/or dielectric body (e.g., such as when the frequency and/or impedance in relation to a transmission-line-signal connection of the circuit must be maintained for optimal performance, but the environment changes over time), wherein the variable disturbance 66 must be accommodated by changing the variable inductor and/or the variable capacitor. Accordingly, in some embodiments, an impedance-mismatch detector 241 and/or a voltage-standingwave-ratio (VSWR) detector 242 are used to determine whether and how to modify the values of the inductance and capacitance in order to rebalance the impedance. for example, if circuit portion 93A has power amplifier output stages 107 (see FIG. 1D) each having a characteristic impedance Z0 and a characteristic frequency F0, and transmit antenna elements 120 each have the same characteristic impedance Z0, then the transmit circuit would be considered balanced. Similarly if the receive-preamplifier input stages 109 (see FIG. 1D) each have a characteristic impedance Z0 and a characteristic resonance frequency F0, and receive antenna elements 120 each have the same characteristic impedance Z0, then the receive circuit would be considered balanced. In some embodiments, the characteristic RLC values also determine a characteristic frequency F0 or characteristic Q0 (the quality of a resonant circuit). If then the variable disturbance 66 modifies the characteristic impedance of circuit portion 93A to a changed characteristic impedance Z0+ΔZ, then impedance-mismatch detector 241 and/or a voltage-standing-wave-ratio detector 242 would detect the change, and they send signal(s) to motor controller 245, which causes motor 240 to modify the variable portion(s) of capacitance and/or inductance to rebalance the impedances of each portion. If then the variable disturbance 66 changes and modifies the characteristic frequency F0 or characteristic Q0 of circuit portion 93A (by changing an RLC parameter) combined with circuit portion 93B to a changed characteristic frequency F0+ΔF or characteristic Q0+ΔQ, then frequency detector 243 and/or a Q detector (not shown) would detect the change, and they send signal(s) to motor controller 245, which causes motor(s) 240 to modify the variable portion(s) of capacitance and/or inductance to reset the frequency and/or Q of each portion.

In some embodiments, each of the components including the power amplifier 107 within remote environment 202 is made of materials that do not contain combinations of iron, nickel, cobalt, or the like that may be moved (physically displaced) by the high field, in order that the high field does not move these components.

In some embodiments, all or the relevant components including the distributed power amplifiers are in a single location, and the present invention is used to adjust component parameters to compensate for some environmental change or a change in the physical surroundings of the circuit that affected any of the RLC parameters. for example, the mere presence of a person or other modality (that might be used to tune some aspect of a circuit) might adversely affect a resistance, inductance or capacitance. In those cases, some embodiments of the invention facilitate the adjustment of the resistance, inductance or capacitance values without a person needing to be in the vicinity. As another example, some circuits may need to be tuned to have a certain resistance, inductance and capacitance in the presence of a person (where a person in the vicinity changes these parameters by their presence, or due to physical or physiological motion (e.g., breathing, heart beating, gastrointestinal movement, and the like) by the person), but the position, body composition and size of the person is unknown and must be compensated for, and some embodiments of the invention facilitate the adjustment of the resistance, inductance or capacitance values to automatically compensate for those characteristics of the person in the vicinity. In some embodiments, conventional magnet-based motors or electric-field based motors themselves would have an undesired effect on the resistance, inductance and capacitance of a sensitive circuit (or such motors could themselves be adversely affected by high magnetic or electric fields), so piezo-electric motors as described herein have the advantage of not interacting (or interacting very little) with the resistance, inductance and capacitance being adjusted.

Figure 3A:
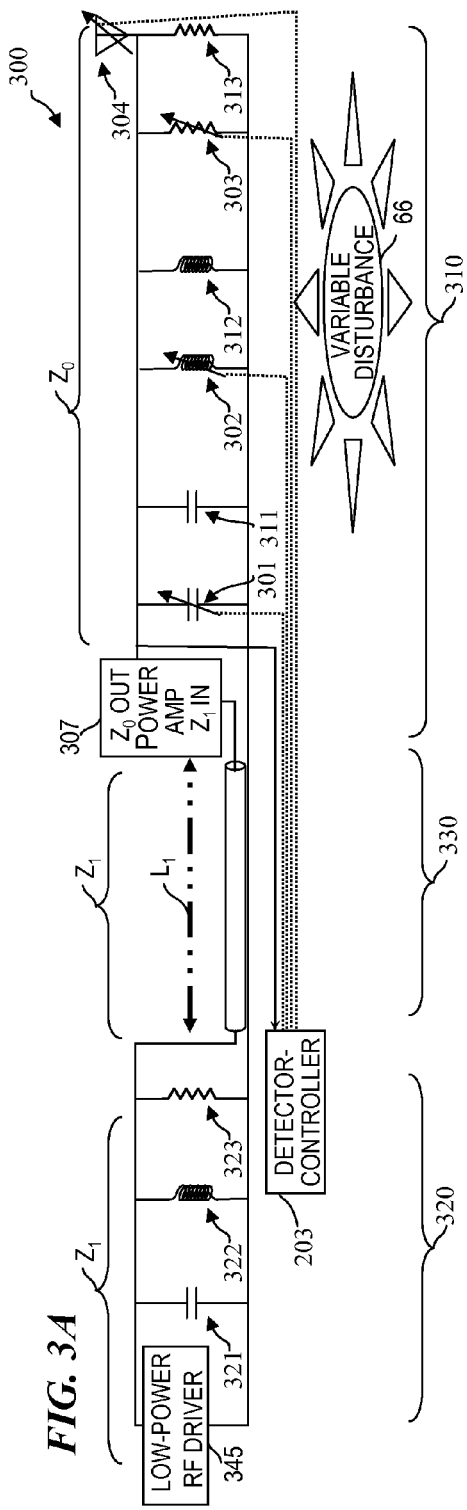
FIG. 3A is a block diagram of an impedance-matched high-frequency circuit 300 according to one embodiment of the present invention, and having an external impedance disturbance 66 having a first effect on circuit 300.

FIG. 3A is a block diagram of an impedance-matched high-frequency circuit 300 according to one embodiment of the present invention, and having an external impedance disturbance 66 having a first effect on circuit 300. In some embodiments, a driver circuit 320 has a characteristic impedance Z1 composed of (or modeled by) an equivalent capacitance 321, equivalent inductance 322, equivalent resistance 323, and ideal voltage source driver 345 (which outputs a voltage signal having one or more frequency components and optionally a DC component, but is modeled as having a very high or infinite impedance such that its impedance does not affect the circuit). In other embodiments, ideal voltage source driver 345 is replaced by an ideal voltage sensor or transceiver (transmitter-receiver combination) (having a very high or infinite impedance such that its impedance does not affect the circuit). Of course, in other embodiments, the parallel connection of equivalent capacitance 321, equivalent inductance 322, equivalent resistance 323 and low-power RF driver voltage source 345 can be replaced with a series-wired connection of a capacitance, inductance, resistance and an ideal current source (and/or ideal current detector, each having zero or negligible impedance) that can provide the same characteristic impedance Z1. Driver circuit 320 is electrically coupled to a transmission line segment 330 (i.e., of transmission line 219 as shown in the other various Figures herein) also having the characteristic impedance Z1 at the respective frequencies of interest in the signal, and transmission line segment 330 is in turn electrically coupled to the input port (also having the characteristic impedance Z1 at the respective frequencies of interest in the signal) of a remote amplifier 307 whose output (having a characteristic impedance Z0 at the respective frequencies of interest in the signal) is connected to a tuned circuit 310, which, in some embodiments, includes an equivalent capacitance (that includes a fixed capacitance component 311 and a variable capacitance component 301 that can be tuned as described in U.S. patent application Ser. No. 12/719,841 titled "REMOTELY ADJUSTABLE REACTIVE AND RESISTIVE ELECTRICAL ELEMENTS AND METHOD" filed 8 Mar. 2010, which is incorporated herein by reference), an equivalent inductance (that includes a fixed inductance component 312 and a variable inductance component 302 that can be tuned as described in U.S. patent application Ser. No. 12/719,841), and an equivalent resistance (that includes a fixed resistance component 313 and a variable resistance component 303 that can be tuned as described in U.S. patent application Ser. No. 12/719,841).

In some embodiments, the characteristic impedance Z1 of low-power RF driver 345 and its equivalent capacitance 321, equivalent inductance 322, and equivalent resistance 323 matches the characteristic impedance Z1 of cable 330 and the characteristic impedance Z1 of the input port of remote power amplifier 307. Also, in some embodiments, the characteristic impedance Z0 of the output port of remote power amplifier 108 307 matches the characteristic impedance Z0 of the antenna element 310 in the presence of variable disturbance 66. Note that in some embodiments, Z1 is designed to be equal to Z0 for convenience, while in other embodiments, Z1 is set to a first value that is easiest to meet for a given RF driver 345, cable 330 and the input impedance of power amplifier 307, while Z0 is set to a value that is more convenient for meeting given the output impedance of power amplifier 307, and the characteristic impedance of the output resonant-filter frequency and antenna array elements 304.

In some embodiments, detector-controller 203 is physically located in the distal control room 320, and measures and controls the Z0 from this distal location, as shown in FIG. 3A. When in the distal location, detector-controller 203 need not be high-field compatible. In other embodiments, detector-controller 203 is physically located in the remote environment 310, and measures and controls the Z0 from this location in remote environment 310. When in the remote environment 310, detector-controller 203 should be high-field compatible (e.g., made completely of non-ferrous materials). In some embodiments, having the distributed power amplifier 307 as well as the variable components 301, 302, and 302 all located in the remote environment 310 may make it most convenient to also locate the detector-controller 203 in the remote environment 310 adjacent the parts it is measuring and controlling rather than in the distal control room 320.

In some embodiments, at least one variable antenna element 304 is included (e.g., in some embodiments, coupled to the upper nodes of variable capacitor 301, variable inductor 302, and variable resistor 302, wherein the physical length, position and shape of one or more antenna elements are varied (such as described in U.S. patent application Ser. No. 12/719, 841 titled "REMOTELY ADJUSTABLE REACTIVE AND RESISTIVE ELECTRICAL ELEMENTS AND METHOD" filed 8 Mar. 2010, which is incorporated herein by reference) under the control of detector-controller 203 shown in FIG. 2). In some embodiments, when in the presence of a variable disturbance 66 having a first characteristic (such as a piece of material, a person, or a weather situation), the capacitance, inductance and/or resistance of tuned circuit 310 are adjusted by varying the variable aspects of variable capacitance component 301, variable inductance component 302 and variable resistance component 303 using one or more sensing units (such as detectors 241, 242 and 243 of FIG. 2) and one or more motor controllers 145 and motors 140 (see FIG. 1C). In some embodiments, a detector-controller 201 (which may include circuit and/or microprocessor components, such as described above for FIG. 2) is coupled (e.g., in some embodiments, connected to transmission line 219) to measure electrical parameters of the signals (e.g., at the left end of transmission line 219), and based on the measurement(s), to control the variable parameters (e.g., resistance, inductance, capacitance, antenna length, resonant frequency, impedance at a given frequency, field shape, field direction, field spatial shape, field intensity, and like characteristics) in the remote tuned circuit 310.

Figure 3B:
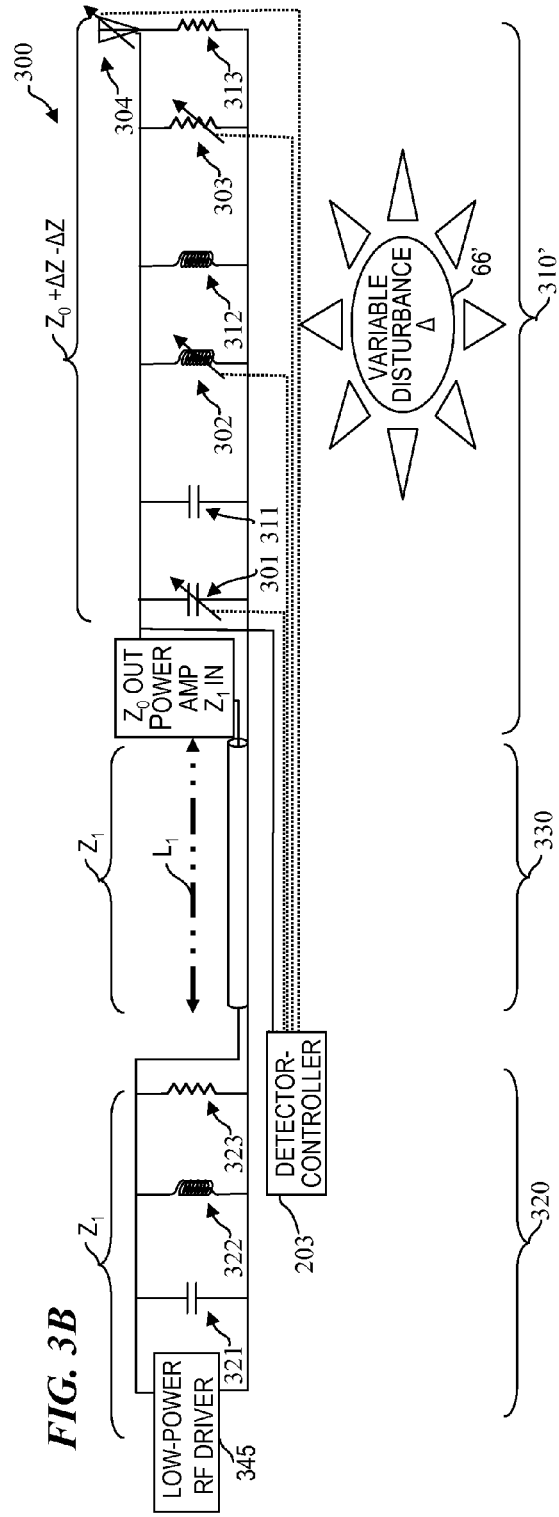
FIG. 3B is a block diagram of impedance-matched high-frequency circuit 300, and having a different external impedance disturbance 66' having a second effect on circuit 300.

FIG. 3B is a block diagram of impedance-matched high-frequency circuit 300, and having a different external impedance disturbance 66' having a second effect on circuit 740 300 (e.g., adding some impedance offset $\Delta Z$ such that the impedance of circuit 310 without compensation would be $Z0+\Delta Z$). In some embodiments, the present invention is used to adjust the RLC parameters of variable components 303, 302 and 301 and optionally the length of antenna 304 in order to subtract a compensating impedance ($-\Delta Z$) rebalance the circuit 310' to again have the characteristic impedance $Z0$ ($=Z0+\Delta Z-\Delta Z$) that matches the output impedance of the remote power amplifier 307 (in terms of characteristic impedance, frequency, Q, and/or other factor) in the presence of the changed external impedance disturbance 66'. In some embodiments, the present invention provides the capability to automatically adjust such parameters in the adjusted tuned circuit 310' "in real time" (i.e., quickly as the external impedance disturbance 66' changes over time).

FIG. 4A is a block diagram of a variable antenna subsystem 401, wherein each antenna element 420 is driven by its own pair of FETs having the complementary polarities (i.e., P-type and N-type) according to one embodiment of the present invention, wherein variable antenna element 420 is set to a first length, and CMOS FETS 412 and 413 are mounted on antenna element 420 for better impedance matching and heat-control. As discussed above, some embodiments include the detector-controller 203 in the control room 80 (distal from the distributed power amplifier 410). In some embodiments, the distributed power amplifier 410 includes a Class D RF driver 416 for CMOS output transistors (P-type FET 412 and N-type FET 413), and provides a duty-cycle-modulated (DCM) signal (e.g., in some embodiments, a PWM signal) that when filtered by the antenna and its variable RLC circuit 117, produces the desired RF pulse (which includes a plurality of cycles of RF radio waves (e.g., radio waves tuned to a Larmor frequency) used to excite the nuclear-magnetic-resonance (NMR) response in the tissues of the patient). In some embodiments, the variable RLC circuit 117 and antenna 420's length are controlled by detector-controller 203 in the control room 80, while in other embodiments, variable RLC circuit 117 and antenna 420's length are controlled by frequency-impedance matching (FIM) circuitry (equivalent to detector controller 203) that is within the MR magnet bore 91. In some embodiments, each of a plurality of antenna elements 420 has its own power amplifier and impedance-matching circuitry 404 (e.g., shown as 404, 404.1, through 404.2), and in some embodiments, they share a common RF oscillator 415 (or PWM-signal source) and a common power supply 105 (which may include a voltage or current source). In some embodiments, the control signal 77 includes a wireless link, while in other embodiments, a wired (e.g., coax or 10-gigabit category 6A cable or the like). Because the power amplification is done in the remote environment 202, the need for very-high-power coax (conventional systems may need coax capable of carrying 30 kW or more) is reduced or eliminated, and wireless communication of the low-power RF signal or even just generation of a local RF signal in the remote environment 202 can be done wirelessly.

FIG. 4B is a block diagram of variable antenna subsystem 402, wherein each one of a plurality of antennae is driven by a pair of FETs having the same polarity (e.g., both N-type in some embodiments) according to one embodiment of the present invention, wherein variable antenna 410 is set to a second length. This subsystem 402 is substantially similar to subsystem 401 of FIG. 4A, except that the CMOS pair of transistors 412 and 413 is replaced by a pair of NMOS transistors 413 and 413', and the Class D RF driver 416 for CMOS output transistors has been replaced by a Class D RF driver 417 for NMOS output transistors (N-type FET 413' and N-type FET 413), and provides a bias-adjusted (biased to provide the proper voltages for turning one transistor completely off when the other transistor is completely on) DCM signal (e.g., in some embodiments, a PWM signal) that when filtered by the antenna and its variable RLC circuit 117, produces the desired RF pulse (a plurality of cycles of RF radio waves used to excite the nuclear-magnetic-resonance (NMR) response in the tissues of the patient), and provides a duty-cycle-modulated (DCM) signal (e.g., in some embodiments, a PWM signal) that when filtered by the antenna and its variable RLC circuit 117, produces the desired RF pulse (a plurality of cycles of RF radio waves used to excite the nuclear-magnetic-resonance (NMR) response in the tissues of the patient). In the embodiment shown, the length of antenna element 420 is shown as adjusted (lengthened to configuration 420' in this case).

Figure 4C:
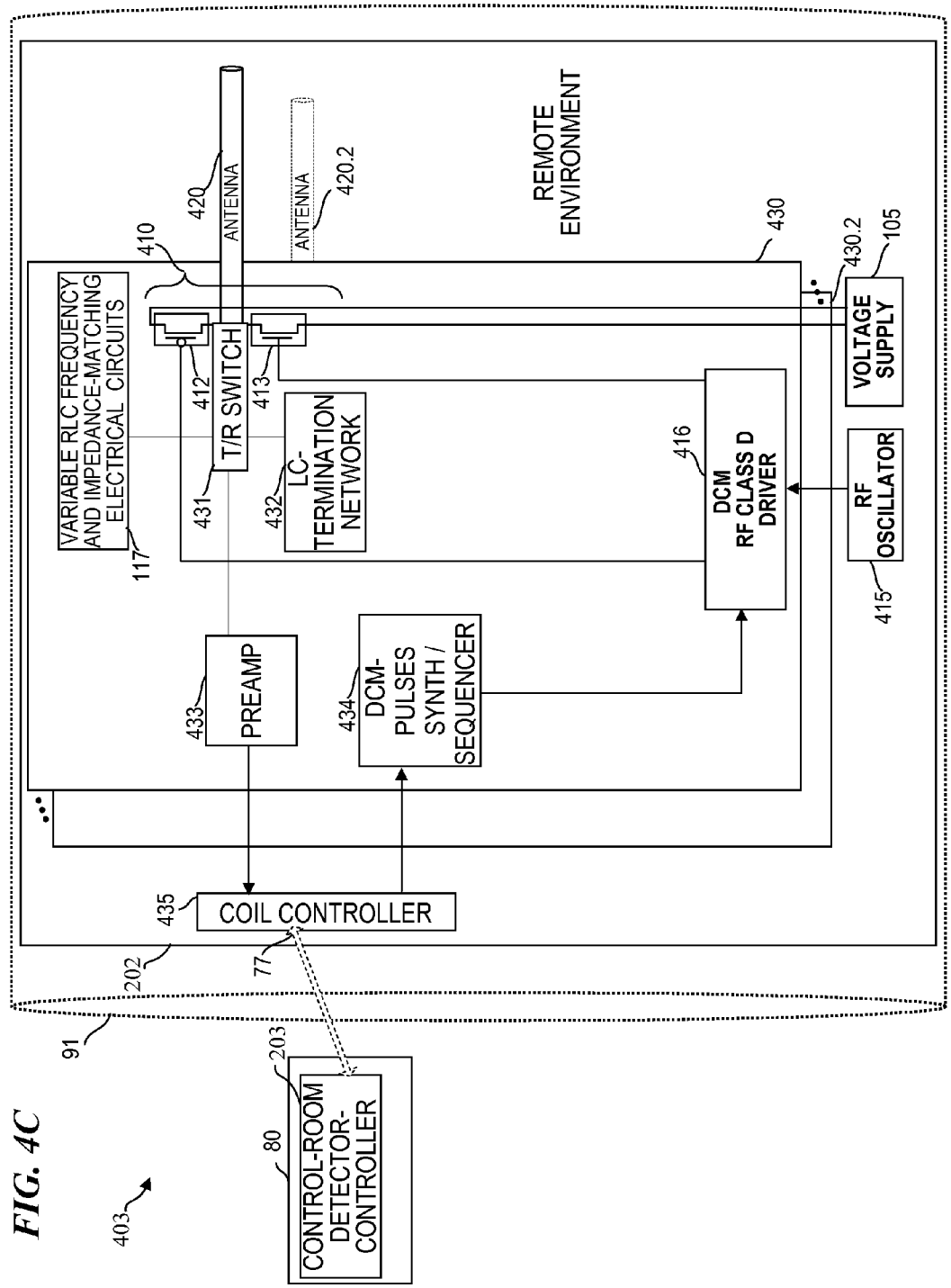
FIG. 4C is a block diagram of variable antenna subsystem 403 driven by a pair of power-amplifier FETs, and including a receive pre-amplifier and a transmit/receive (T/R) switch to change from transmit mode to receive mode, according to one embodiment of the present invention.

FIG. 4C is a block diagram of variable antenna subsystem 403, wherein each one of a plurality of antennae is driven by a different transmit-amplifier and receiver-pre-amplifier unit 430. In some embodiments, unit 430 includes a power amplifier (e.g., driver 416 and one or more transistor(s) 412-413), a receive pre-amplifier 433, and a transmit/receive (T/R) switch 431 used to change from transmit mode to receive mode, according to one embodiment of the present invention. In some embodiments, the heat-generating elements (e.g., the power FETS 412-413) are mounted on and/or thermally connected to antenna element 420 for better impedance matching and heat-control. As discussed above, some embodiments include the detector-controller 203 in the distal control room 80 (distal from the distributed power amplifier and receiver preamp unit 430). In some embodiments, the distributed power amplifier 430 includes a Class D RF driver 416 for CMOS output P-type FET 412 and N-type FET 413, such as shown in FIG. 4A and described above. In other embodiments, rather than using a Class D power amplifier as shown here, other types of RF power amplifiers are used, including Class A, Class AB, or other suitable types. Although shown here as including a p-FET 412 and n-FET 413, the output stages in other embodiments include any other suitable electronic or opto-electronic amplifier devices. In some embodiments, the variable characteristics of RLC circuit 117 and antenna 420's variable length are controlled by detector-controller 203 in the control room 80, while in other embodiments, variable RLC circuit 117 and antenna 420's length are controlled by frequency-impedance matching (FIM) circuitry in coil controller 435 (in some embodiments, equivalent to that which is otherwise included in detector controller 203) that is within the MR magnet bore 91. In some embodiments, each of a plurality of antenna elements 420-420.2 has its own power amplifier and impedance-matching circuitry 430-430.2 respectively, and in some embodiments, they share a common RF oscillator 415 (or PWM-signal source) and a common power supply 105 (which may include a voltage or current source). In some embodiments, the control signal 77 includes a wireless link, while in other embodiments, a wired (e.g., coax, 10-gigabit category 6A cable or the like) or optical fiber is used for carrying the control and/or RF signals. Because the power amplification is done in the remote environment 202, the need for very-high-power coax (conventional systems may need coax capable of carrying 30 kW or more) is reduced or eliminated, and wireless communication of the low-power RF signal or even just generation of a local RF signal in the remote environment 202 can be performed and controlled wirelessly. In some embodiments, the low-power DCM signal pulses (which can be up to 4.5 GHz or higher) are generated in circuit 434 in the remote environment 202. In other embodiments, these DCM pulse streams are generated in the control room 80 (or elsewhere away from the magnet bore) as low-power electrical signals, and are carried to subsystem 403 via low-power coax or high-speed Ethernet cabling (wherein such electrical cabling is made of polymers, copper or other high-field MR-compatible materials).

In still other embodiments, these DCM pulse streams are generated in the control room 80 (or elsewhere away from the magnet bore) as optical signals, and are carried to subsystem 403 via optical fiber. In some such embodiments, DCM RF driver 416 converts the optical signals to electrical pulses that drive the output FET(s) 412-413. Note that in embodiments using Class AB or other types of output stages, the optical signal may represent the actual RF cycles of the desired Larmor-frequency excitation pulse. In some embodiments, the optical signal (or other low-power signal) is pre-distorted in order to compensate for characteristics of the power-amplifier circuitry in portion 404, in order to obtain the desired high-power RF output signal.

In some embodiments, each set of output transistor(s) 412-412 are directly connected to their respective antenna element 420 using very short leads, to reduce mismatched impedances. In other embodiments, T/R switch 431 includes a multiple-pole electronic switch or RF relay (e.g., in some embodiments, including PIN diodes or other suitable switching diodes such as described in U.S. Pat. No. 4,763,076 to Arakawa et al. (incorporated herein by reference)) that switches from a transmit state or mode to a receive state or mode. In transmit mode, the output of the power amplifier (having an output impedance that matches the impedance of antenna 420) is coupled to antenna 420 to transmit its output signal, and simultaneously the input to the preamp 433 is disconnected from the antenna and instead is coupled to a matched terminating impedance (a terminating impedance that matches the input impedance of the preamp 433) such that substantially no signal gets coupled to the input of preamp 433. In receive mode, the input to the preamp 433 is coupled to antenna 420 to receive its input (received) signal, and simultaneously the output of the power amplifier is disconnected from the antenna and instead is coupled to a matched terminating impedance (a terminating impedance that matches the output impedance of the power amplifier 410) such that substantially no signal from the power amplifier gets inadvertently coupled to the input of preamp 433 (and in some embodiments, both FETs 412 and 413 are turned off (to a high impedance state)). When in receive mode, the circuit disconnects or disables the RF source signal from the input of the driver circuit 416. In some embodiments, a second T/R switch (not shown) similar to T/R switch 431 described above is used, when in the receive state, to disconnect signals from the input of driver 416 and to instead connect a matched termination impedance 437 to the input of driver 416, but when in the transmit state, connect signals from circuit 434 to the input of driver 416 and the impedances of these are matched to one another. In other embodiments, the second T/R switch is omitted. In some embodiments, controller 435 supplies control signals to control the switching of T/R switch 431 and/or the second T/R switch and/or driver 416 (in order to turn off both FETs 412 and 413 when in receive mode).

In some embodiments, controller 435 supplies control signals to frequency-and-impedance-matching (FIM) circuit 117 (in order to adjust impedances of the various transmission-line elements that carry signals from one output to another input to match one another, and to match the resonance frequencies of various elements to the desired transmit or receive frequencies) and receives and measures appropriate sense signals (e.g., to measure voltage-standing-wave ratios (VSWRs) or other suitable parameters, in order to control the FIM operations).

FIG. 5A shows the waveforms of a control pulse 500 used in some embodiments to obtain a PWM seed signal. In some embodiments, control pulse 500 determines the start time and duration of the output RF pulse 505 (see FIG. 5E).

FIG. 5B shows the waveforms of an RF sine-wave seed signal and a gated higher-frequency triangle or saw-tooth wave use in some embodiments to obtain a PWM seed signal. In some embodiments, these two signals are compared such that for each time period when the triangle wave is greater than the sine wave, a pulse is generated. The resulting PWM pulse stream 503 is shown in FIG. 5C.

FIG. 5C shows the waveform of a PWM seed signal 503. In some embodiments, this signal is generated as described in FIG. 5B. In other embodiments, other ways of generating a comparable waveform are used (e.g., cyclic digital oscillators, table lookup from a high-speed memory or the like).

FIG. 5D shows the waveform of an amplified PWM signal 504. Because of the rise and fall times of this signal being much faster than the dv/dt (change in voltage over time) of the RF sine wave, the efficiency of a Class D power amplifier is greater than alternatives such as a Class AB power amplifier. This PWM signal is then fed to a high-Q resonator that includes the antenna element (e.g., circuit 117 and antenna 420 of FIG. 4A or 4B), which performs a narrow-bandwidth bandpass filter function and outputs the signal shown in FIG. 5E.

FIG. 5E shows the waveform of a filtered amplified RF sine-wave signal 505 resulting from the process described for FIGS. 5A-5D above.

Figure 6:
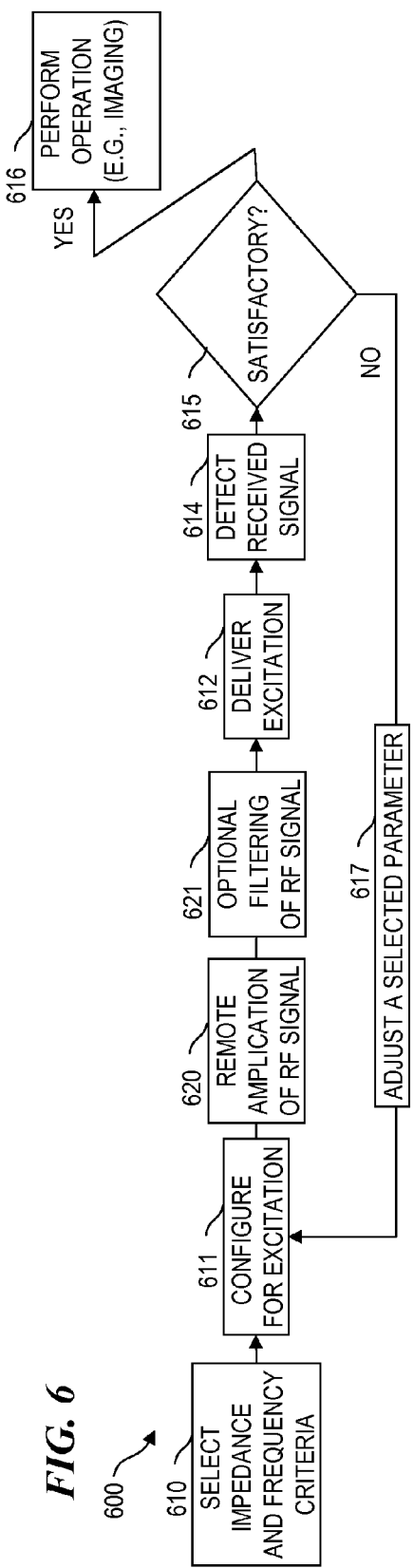
FIG. 6 is a flowchart of a method 600 according to some embodiments of the invention.

FIG. 6 is a flowchart of a method 600 according to some embodiments of the invention. In some embodiments, method 600 starts by selecting 610 one or more (e.g., in some embodiments, a plurality of) criteria (in some embodiments, parameters such as impedance and frequency, in other embodiments, any other desired condition) to optimize. Next, a circuit (e.g., under control of non-magnetic mechanical movement devices) performs configuring 611 for excitation (e.g., transmitting to or receiving from) the remote circuit elements. In some embodiments, the RF excitation signal is power amplified 620 by a power amplifier located on or next to the antenna element, and filtered 621 at the high-Q antenna. The next block includes delivering 612 the excitation (radiating the RF radio waves in the MR magnet bore). The next block includes detecting 614 a received signal from the remote elements. The next block includes checking 615 for satisfactory parameters (e.g., the impedance and frequency of the signal) of the received signal from the remote elements. If the result is unsatisfactory, the method then includes adjusting 617 one or more of the variable reactance elements using the non-magnetic mechanical movement device(s) and going to block 611 to iteratively repeat the process 611 through 615. If the result of checking 615 is satisfactory, the method goes to performing 616 the operation for which the components were adjusted (e.g., obtaining a magnetic resonance result (such as an image).

In some embodiments, the present invention uses distributed power amplifiers along with electronically controlled frequency-impedance-matching circuits (e.g., PIN diode-controlled capacitances and/or inductances and/or antenna lengths) and/or variable resistors, inductors and/or capacitors that have their electrical-circuit values controlled by one or more electrically controlled mechanical positioners. In some embodiments, the distributed power amplifiers and electronically controlled FIM circuits include metals that have only substantially non-magnetic components such that the resistors, inductors and/or capacitors and the mechanical positioner(s) that adjust their variable values can be placed and operated within and/or near an extremely high electric field of many thousands of volts (such as connected to or affecting electricity-transmission lines carrying hundreds of thousands of volts and very large currents), or extremely-high magnetic field such as within the very strong superconducting-wire magnets of high-energy particle-physics experiments (such as the Large Hadron Collider) or within magnets of a magnetic-resonance imaging machines, or during and after an electromagnetic pulse (EMP) from a nuclear event.

Some embodiments of the invention include an apparatus that includes a non-magnetic positioner, and an electrical component connected to the motor and configured to have at least one of its parameters varied by the positioner. In some embodiments of the apparatus, the positioner comprises a piezo-electric motor. In some embodiments of the apparatus, the electrical component includes an inductor, and wherein the at least one of its parameters includes an inductance. In some embodiments of the apparatus, the electrical component includes a capacitor, and wherein the at least one of its parameters includes a capacitance. In some embodiments of the apparatus, the electrical component includes a resistor, and wherein the at least one of its parameters includes a resistance. Some embodiments further include a programmable information-processing device operatively coupled to control the positioner in order to vary an electrical parameter of the electrical component. Some embodiments further include a feedback circuit operatively coupled to the programmable information-processing device to provide feedback control of the positioner in order to maintain the electrical parameter of the electrical component.

Some embodiments of the invention include an apparatus that includes an electrical component, and means, as described and shown herein and equivalents thereof, for automatically adjusting its impedance.

In some embodiments, the method of the present invention is executed on a computer at a location remote from a user, and controlled by the user across the internet. In some embodiments, the method is executed on a computer at a location remote from the variable electrical components. In some such embodiments, the method is controlled by the computer across a network.

In some embodiments, the present invention includes one or more of any one or more of the devices in any of the figures herein in a combined circuit that connects the described variable components and distributed power amplifiers, optionally including other conventional components. In some embodiments, the present invention provides an RF coil for MRI or EPR (electron paramagnetic resonance) spectroscopy or imaging, or any other antenna, wherein a combination of coil and amplifier-places the RF power amplifier for the system out of external box (the circuitry in the distal control room) and instead distributes the power amplification over the body of the coil (e.g., placing a power amplifier at or on each of a plurality of antenna elements). In the old days, push-pull tubes or distributed solid-state designs involved buying very many power FETS to combine efficiently two to four FETs per board to get 450-500 Watts per board, then combine boards with more combiners to get 20 kW to 40 kW (standard is 35 kW) needed for MRI's RF pulse signal. Typically such a box is located outside the MRI magnet room. It incurs lots of loss in the combining and then more in cables and coils in the magnet. The cost of such a power amp is second only to the cost magnet in the expense of building an MRI machine. The expensive cabling is type-rg214 or rg400 cables from the combined output of multiple power amplifiers and the distributed to multiple antennas.

In contrast, the present invention provides power FETs, one or more per each of a plurality of coil elements, and thus the present invention can omit combiners-mount one FET amplifier per coil element. In some embodiments, it uses the coil elements for the heat sink of the power amplifiers, and distributes the heat over the coil, which in various embodiments, includes any multiple-element coil. In some embodiments, the coil includes a body, head, or surface coil for an MRI machine. In some embodiments, the RF and/or control send signals wirelessly or over small cables or over optical fibers. The present invention provides, for the first time, a capability to wirelessly send or control the RF to the transmit coils. In some embodiments, dedicated amplifiers are provided for dedicated elements. The present invention facilitates manipulation of the field to use for $B_1$ shimming or transmit-sense functionality. The present invention provides better imaging since it easily switches from different subsets of the multiple individually controlled elements to change the transmitted signal's phase, magnitude, spatial profile (field shape in space), temporal profile (pulse shape in time), and frequency (all controllable as independent variables), in order to optimize the signal to particular position of interest (VOXEL), to maximize signal-to-noise (SN) and/or contrast and/or spectral and/or spatial resolution, as well as minimizing specific absorption rate (SAR) and heating of the patient and components in the magnet bore. The present invention provides better performance through parallel imaging (this saves time especially), especially when using parallel transmit signals (e.g., in some embodiments, using a plurality of parallel optical fibers to carry the transmit signals (e.g., either the DCM pulses to drive a Class D output that then filters to obtain the RF transmit pulse, or the RF pulse itself for a Class AB output, and optionally pre-compensates or distorts the signal on the optical fiber), or RF parallel transmit-receive. In some embodiments, the present invention provides transmit sense capability (which transmits different pulse widths over different antenna elements). In some embodiments, this provides RF-field focussing and optimization.

In some embodiments, the present invention gets receive signals from multiple antenna elements in parallel, generates and carries these as electrical or optical signals to the distal control room, then combines these signals (externally to the magnet room). In some embodiments, the apparatus transmits signals from many of elements simultaneously, which saves time on spatial encoding. In some embodiments, speed-up or acceleration factors of 5-6 times or more are obtained for given image or given quality from this parallel imaging. The present invention provides faster MRIs, a better control over RF to the region of interest, uses higher frequencies for better S/N, and controls shim fields better. In some embodiments, the present invention provides a better coil that includes both parallel transmit or parallel transmit-receive in the RF coil itself.

In some embodiments, the present invention provides one or more of the following features and/or advantages:

distributed receive amplifiers at T/R switches in coil power amplifier distributed over coil, with 1 or more FETS on or near coil element support for various coil elements stripline, loop, dipole antenna, monopole antennas connection methods between power amplifier and antenna elements include wirebond, solder directly to it, mount FET chip directly to coil element, screw stud of FET into end or side of antenna element.

In some embodiments, a wireless transmit coil that has wireless receiver on the element in magnet to obtain better S/N, which still needs a DC power cable that is relatively small out-of way wires rather than huge RF power coax cables. In some embodiments, it may have other control lines to FET like T/R switch control. There are lots of ways of execution. In some embodiments, 16 or 32 parallel rods in cylindrical coil unit are used—the antenna elements can include cylindrical or coaxial-adjustment antenna elements. The entire coil can be a volume coil (cylindrical or ellipsoidal or other odd shapes) or just surround volume as a surface (flat or curved plane(s)) coil. The power amplifier can mount on end (voltage source for half-wave capacitively shortened resonator or stripline or microstrip or coaxial line) or center (current source for dipole antenna.) The elements can be arranged as any other array form with antenna elements displace in XY or XYZ directions. In some embodiments, the present invention provides a pair of arrays that are end-to-end to one another. The present invention facilitates more geometries because there is more real estate (volume room). Other things that are dedicated on, at or near element:

power amplifier (power FET)

preamp GAAS FET pin diode switch

T/R switch (PIN)

wireless receiver—RF input to transmitter)

wireless transmitter—get signal from preamp and send to external wireless controls—control PIN switch to tell when to switch to turn power amp on-off, pr receiver on-off (or "blank" one or both)

hardwire or program on-board memory to drive long pulse sequences at chip active tuning-smart VSWR tuning or go back to through wireless or wired control to console computer (auto tuning or matching).

In the past, the only elements were preamps or PIN switching of xmit (transmit)—receive or detune receive element during transmit so it doesn't receive what is being transmitting. In some embodiments, the power amplifier FETs—commonly M150 (Motorola 150-Watt) and up to 1.2 kW are used. In a 16-element coil, that provides 16 kW at same time (should be far cheaper and far more efficient than sending 30 kW from outside room). The power FET on board gives you all the other features such as wireless transmit. In some embodiments, the present invention provides cooling water or other cooling fluid, or air (fans), especially if we have high efficiency amplifiers (can go to 32, 64, or 128 elements), and distribute heat over many elements and air though coil. The gradient coils are cooled with water. In some embodiments, the invention embeds the RF coils into magnet or insert into magnet with the patient.

In some embodiments, the RF coil unit size is the diameter of the MRI bore (standard bore inside magnet inside Faraday cage industry body coil 65-70 cm in diameter, wherein the active circuit is in range 15-18 cm long to 60 cm long. Head coils are 24-28 cm in diameter and circuit length (element lengths 15-30 cm long-15-25 cm usually). Some embodiments include 8-16-24-32 elements for head coils, body coils are 8 or 16 elements usually, but can have 128 elements. In some embodiments, the number of antenna elements could be non-power-of-two. In some embodiments, digital control elements can adjust gain at power-of-two factors (mostly computer memory and control lines on the receive to sample directly into memory. Some embodiments include sending pulse sequences at 64 MHz. Can simultaneously xmit (transmit) and receive using a circulator xmit (transmit) 120 degrees to element 240 degrees to receiver (typical existing circulators are problematic-cannot use ferrites in magnet) so the present invention uses a ¼-wave circulator waveguide but that is perhaps too big to put into magnet. Some embodiments further include a stripline transmission-line circulator.

In some embodiments, the present invention provides a method that includes: providing an MRI coil having a plurality of antenna elements, including a first antenna element and a second antenna element; locating the MRI coil in a bore of an MR magnet; based on a control signal from a location remote from the plurality of antenna elements, power amplifying a first RF pulse to obtain a first high-power RF pulse and power amplifying a second RF pulse to obtain a second high-power RF pulse; and coupling the first high-power RF pulse to at least the first antenna element but not to the second antenna element and coupling the second high-power RF pulse to at least the second antenna element but not to the first antenna element, wherein the power amplifying is performed in the bore of the MR magnet. Some embodiments of the method further include coupling heat from the power amplifying the first RF pulse primarily to the first antenna element, and coupling heat from the power amplifying the second RF pulse primarily to the second antenna element. In some embodiments of the method, the first RF pulse has a power of less than one watt and the first high-power pulse has a power of at least 100 watts. In some embodiments of the method, the first RF pulse has a power of less than one watt and the first high-power pulse has a power of at least 1,000 watts. Some embodiments of the method further include electrically controlling an impedance of the first antenna element to match an impedance of the power amplifying. Some embodiments of the method further include using a programmable information-processing device operatively coupled to control operation of the power amplifying in the MRI coil from a location at least one meter away from the MRI coil. Some embodiments of the method further include: electrically controlling an impedance of the first antenna element to match an impedance of the power amplifying; and using a feedback signal operatively coupled to the programmable information-processing device to provide feedback control in order to control the impedance of the first antenna element.

In some embodiments, the present invention provides a computer-readable medium having instructions stored thereon for causing a suitably programmed information processor to execute a method that includes: distributively power amplifying RF pulses within a bore of an MR magnet to obtain high-power RF pulses; coupling the high-power RF pulses to a plurality of antenna elements in the bore of the MR magnet; receiving an preamplifying RF signals from the plurality of antenna elements in the bore of the MR magnet; and controlling the distributively power amplifying and the preamplifying of the received RF signals. In some embodiments of the computer-readable medium, the method further includes power amplifying the RF pulses to a power of at least 1000 watts per antenna element. In some embodiments of the computer-readable medium, the method further includes controlling resistance, inductance and capacitance (RLC) values of a circuit.

In some embodiments, the present invention provides an apparatus that includes: an MRI coil unit having a plurality of antenna elements, including a first antenna element and a second antenna element, wherein the MRI coil unit is compatible for use in a bore of an MR magnet; and a plurality of power amplifiers, including a first power amplifier and a second power amplifier, the plurality of power amplifiers located in the MRI coil unit, wherein the first power amplifier is configured, based on a control signal from a location remote from the plurality of antenna elements, to power amplify a first RF pulse to obtain a first high-power RF pulse, wherein the first high-power RF pulse is coupled to at least the first antenna element but not to the second antenna element, and wherein the second power amplifier is configured to power amplify a second RF pulse to obtain a second high-power RF pulse, wherein the second high-power RF pulse is coupled to at least the second antenna element but not to the first antenna element, wherein the plurality of power amplifiers are configured for operation in the bore of the MR magnet. In some embodiments of the apparatus, the first power amplifier is thermally coupled primarily to the first antenna element and the second power amplifier is thermally coupled primarily to the second antenna element.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," "second," and "third," etc., are used merely as labels, and are not intended to impose numerical requirements on their objects.

What is claimed is:

1. A method comprising:
    providing an MRI coil having a plurality of antenna elements, including a first antenna element and a second antenna element;
    locating the MRI coil in a bore of an MR magnet;
    based on a control signal from a location remote from the plurality of antenna elements, power amplifying a first RF pulse to obtain a first high-power RF pulse and power amplifying a second RF pulse to obtain a second high-power RF pulse; and
    coupling the first high-power RF pulse to at least the first antenna element but not to the second antenna element and coupling the second high-power RF pulse to at least the second antenna element but not to the first antenna element, wherein the power amplifying is performed in the bore of the MR magnet.

2. The method of claim 1, further comprising coupling heat from the power amplifying the first RF pulse primarily to the first antenna element, and coupling heat from the power amplifying the second RF pulse primarily to the second antenna element.

3. The method of claim 1, wherein the first RF pulse has a power of less than one watt and the first high-power pulse has a power of at least 100 watts.

4. The method of claim 1, wherein the first RF pulse has a power of less than one watt and the first high-power pulse has a power of at least 1,000 watts.

5. The method of claim 1, further comprising electrically controlling an impedance of the first antenna element to match an impedance of the power amplifying.

6. The method of claim 1, further comprising using a programmable information-processing device operatively coupled to control operation of the power amplifying in the MRI coil from a location at least one meter away from the MRI coil.

7. The method of claim 6, further comprising:
    electrically controlling an impedance of the first antenna element to match an impedance of the power amplifying; and
    using a feedback signal operatively coupled to the programmable information-processing device to provide feedback control in order to control the impedance of the first antenna element.

8. A non-transitory computer-readable medium having instructions stored thereon for causing a suitably programmed information processor to execute a method that comprises:
    distributively power amplifying RF pulses within a bore of an MR magnet to obtain high-power RF pulses;
    coupling the high-power RF pulses to a plurality of antenna elements in the bore of the MR magnet;
    receiving and preamplifying RF signals from the plurality of antenna elements in the bore of the MR magnet; and controlling the distributively power amplifying and the preamplifying of the received RF signals.

9. The computer-readable medium of claim 8, wherein the medium further includes instructions such that the method further includes:
   electrically controlling an impedance of each one of the plurality of antenna elements to match an impedance of a power amplifier; and
   using a feedback signal to provide feedback control in order to control the impedance of the plurality of antenna elements.

10. The computer-readable medium of claim 8, wherein the medium further includes instructions such that the method further includes:
   controlling operation of the power amplifying in the MRI coil from a location at least one meter away from the MRI coil.

11. The computer-readable medium of claim 8, wherein the medium further includes instructions such that the method further includes power amplifying the RF pulses to a power of at least 1,000 watts per antenna element.

12. The computer-readable medium of claim 8, wherein the medium further includes instructions such that the method further includes controlling resistance, inductance and capacitance (RLC) values of a circuit.

13. An apparatus comprising:
   an MRI coil unit having a plurality of antenna elements, including a first antenna element and a second antenna element, wherein the MRI coil unit is compatible for use in a bore of an MR magnet;
   a plurality of power amplifiers, including a first power amplifier and a second power amplifier, the plurality of power amplifiers located in the MRI coil unit, wherein the first power amplifier is configured, based on a control signal from a location remote from the plurality of antenna elements, to power amplify a first RF pulse to obtain a first high-power RF pulse, wherein the first high-power RF pulse is coupled to at least the first antenna element but not to the second antenna element, and wherein the second power amplifier is configured to power amplify a second RF pulse to obtain a second high-power RF pulse, wherein the second high-power RF pulse is coupled to at least the second antenna element but not to the first antenna element, wherein the plurality of power amplifiers are configured for operation in the bore of the MR magnet.

14. The apparatus of claim 13, wherein the first power amplifier is thermally coupled primarily to the first antenna element and the second power amplifier is thermally coupled primarily to the second antenna element.

15. The apparatus of claim 13, wherein the plurality of power amplifiers is thermally coupled to the plurality of antenna elements.

16. The apparatus of claim 13, wherein the first power amplifier amplifies the first RF pulse from a power of less than one watt to a power of at least 100 watts.

17. The apparatus of claim 13, wherein the first power amplifier amplifies the first RF pulse from a power of less than one watt to a power of at least 1,000 watts.

18. The apparatus of claim 13, further comprising a controller operatively coupled to the first antenna element and configured to electrically control an impedance of the first antenna element to match an impedance of the first power amplifier.

19. The apparatus of claim 13, further comprising a programmable information-processing device operatively coupled to control operation of the plurality of power amplifiers in the MRI coil from a location at least one meter away from the MRI coil.

20. The apparatus of claim 13, further comprising:
   a controller operatively coupled to the first antenna element and configured to electrically perform an impedance adjustment of the first antenna element to match an impedance of the first power amplifier;
   a programmable information-processing device operatively coupled the controller and configured to control operation the impedance adjustment, and to control operation of the plurality of power amplifiers in the MRI coil from a location at least one meter away from the MRI coil; and
   a feedback circuit that generates a feedback signal operatively coupled to the programmable information-processing device to provide feedback control in order to control the impedance adjustment of the first antenna element.

* * * * *

UNITED STATES PATENT AND TRADEMARK OFFICE
CERTIFICATE OF CORRECTION

PATENT NO. : 8,604,791 B2
APPLICATION NO. : 12/879000
DATED : December 10, 2013
INVENTOR(S) : John Thomas Vaughan, Jr. et al.

It is certified that error appears in the above-identified patent and that said Letters Patent is hereby corrected as shown below:

In the Specification

Column 1, Line 3 after the title, insert the following heading and paragraph:
--STATEMENT REGARDING FEDERALLY SPONSORED RESEARCH
This invention was made with government support under EB006835, EB015894, and EB007327 awarded by the National Institutes of Health. The government has certain rights in the invention.--

Signed and Sealed this
Fifteenth Day of August, 2023

Katherine Kelly Vidal
*Director of the United States Patent and Trademark Office*